(12) United States Patent
Yen et al.

(10) Patent No.: US 8,350,544 B2
(45) Date of Patent: *Jan. 8, 2013

(54) VOLTAGE CONVERSION DEVICE CAPABLE OF ENHANCING CONVERSION EFFICIENCY

(75) Inventors: Chih-Jen Yen, Hsinchu (TW); Tsung-Yin Yu, Yilan County (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/342,210

(22) Filed: Jan. 3, 2012

(65) Prior Publication Data

US 2012/0105037 A1 May 3, 2012

Related U.S. Application Data

(63) Continuation of application No. 11/833,249, filed on Aug. 3, 2007, now Pat. No. 8,111,054.

(30) Foreign Application Priority Data

Apr. 30, 2007 (TW) .............................. 96115287 A

(51) Int. Cl.
*G05F 1/40* (2006.01)
*H02M 3/18* (2006.01)

(52) U.S. Cl. ........................... 323/266; 323/282; 363/59

(58) Field of Classification Search ............... 323/266, 323/273, 274, 280–282; 363/59, 73, 74; 327/535–543

See application file for complete search history.

(56) References Cited

U.S. PATENT DOCUMENTS

| | | | |
|---|---|---|---|
| 6,107,862 A | 8/2000 | Mukainakano | |
| 6,411,531 B1 | 6/2002 | Nork | |
| 6,531,852 B2 | 3/2003 | Doutreloigne | |
| 6,985,016 B2 | 1/2006 | Chow | |
| 7,550,954 B2 | 6/2009 | De Nisi | |
| 7,764,525 B2 * | 7/2010 | Hsieh et al. | 363/60 |
| 7,944,277 B1 * | 5/2011 | Sinitsky et al. | 327/536 |
| 8,111,054 B2 * | 2/2012 | Yen et al. | 323/266 |
| 2002/0105289 A1 | 8/2002 | Doutreloigne | |

FOREIGN PATENT DOCUMENTS

| | | |
|---|---|---|
| CN | 1401099 A | 3/2003 |
| CN | 1591115 A | 3/2005 |
| TW | 200520354 | 6/2005 |
| TW | 200532946 | 10/2005 |

* cited by examiner

*Primary Examiner* — Jessica Han
(74) *Attorney, Agent, or Firm* — Winston Hsu; Scott Margo

(57) ABSTRACT

A voltage conversion device capable of enhancing conversion efficiency includes a charge pump for generating output voltage linear to input voltage according to the input voltage, a feedback unit for generating a feedback signal according to the output voltage generated by the charge pump, and a regulating unit for outputting and adjusting the input voltage according to the feedback signal provided by the feedback unit, so as to keep the output voltage unchanged.

37 Claims, 29 Drawing Sheets

VOLTAGE CONVERSION DEVICE CAPABLE OF ENHANCING CONVERSION EFFICIENCY

CROSS REFERENCE TO RELATED APPLICATIONS

This is a continuation application of U.S. application Ser. No. 11/833,249, filed Aug. 3, 2007, which is included in its entirety herein by reference.

BACKGROUND OF THE INVENTION

1. Field of the Invention

The present invention is related to a voltage conversion device capable of enhancing conversion efficiency, and more particularly, a voltage conversion device capable of automatically adjusting a charge pump output voltage under different switch-on resistors and different load currents, to maintain at a preset level.

2. Description of the Prior Art

A charge pump is often used in a booster circuit or a voltage multiplier circuit. For example, a prior art liquid crystal display (LCD) device can utilize a charge pump to raise an output voltage from a lower voltage source, to provide a higher operating voltage for drivers such as source drivers or gate drivers. As shown in FIG. 1 and FIG. 2, the charge pump can be seen as a dual-end element, for converting an input voltage Vi into a positive multiple output voltage Vo (FIG. 1) or a negative multiple output voltage Vo (FIG. 2).

The prior art provides many methods for implementing charge pumps and related circuits. For example, FIG. 3 illustrates a schematic diagram of a constant charge pump 300. The constant charge pump 300 includes a level shifter circuit 302 and a charge-exchange-control switch circuit 304. Clock signals CLK, XCK and control signals S1, S2 provided by the level shifter circuit 302 effectively drive the charge-exchange-control switch circuit 304, so that the constant charge pump 300 converts an input voltage Vi to an output voltage Vo accurately for voltage boosting or voltage multiplying. However, the constant charge pump 300 is only suitable for operating with a smaller load change. If the constant charge pump 300 is applied on a design that has a larger load change, under a low load condition, the efficiency of the charge pump 300 seriously decays, and the charge pump 300 might not be able to operate when the load is too large.

The prior art further provides a capacitor push-pull charge pump 400, as shown in FIG. 4. The capacitor push-pull charge pump 400 includes a level shifter circuit 402 and a charge-exchange-control switch circuit 404. The charge-exchange-control switch circuit 404 is the same as the charge-exchange-control switch circuit 304 in FIG. 3, while in the level shifter circuit 402, the output transistors of the level shifter circuit 302 is replaced by output capacitors. Under this condition, the capacitor push-pull charge pump 400 can adjust the amplitude of the clock control signals according to charge loads, so as to automatically reduce the transforming charges, in order to provide a higher efficiency. However, the clock signal level of the capacitor push-pull charge pump 400 cannot reach a full voltage, and the output voltage Vo is not stable and varies with the load.

In short, there is an equivalent resistor (switch-on resistor) when the charge pump switch is on. A load current passing through the switch-on resistor decreases the average of a direct current level of the output voltage, and the greater the switch-on resister is, the more the load current varies, and the more the average voltage decreases. If the switch rate of the charge pump is adjusted to restrain the drop of the average voltage, the output voltage Vo might be greater than the voltage requirement of the load circuit power source, and cause serious efficiency loss.

In order to solve the above-mentioned problems, a prior art charge pump can couple a voltage regulator to the output end, to generate the output voltage Vo as shown in FIG. 5 and FIG. 6. However, there are two defects in the charge pump: one is a voltage stabilization capacitor $C_L$ should be attached, another is the charge pump multiplies the input voltage to a very high output voltage VCC or VEE, then decreases the voltage with the voltage regulator, which loses efficiency.

SUMMARY OF THE INVENTION

It is therefore a primary objective of the claimed invention to provide a voltage conversion device capable of enhancing a voltage conversion efficiency.

The present invention discloses a voltage conversion device capable of enhancing a voltage conversion efficiency, which comprises a charge pump for generating an output voltage linearly related to an input voltage, a feedback unit for generating a feedback signal according to the output voltage generated by the charge pump, and a regulating unit for outputting and adjusting the input voltage according to the feedback signal provided by the feedback unit, for keeping the output voltage at a predefined level.

These and other objectives of the present invention will no doubt become obvious to those of ordinary skill in the art after reading the following detailed description of the preferred embodiment that is illustrated in the various figures and drawings.

DETAILED DESCRIPTION

Figure 7:
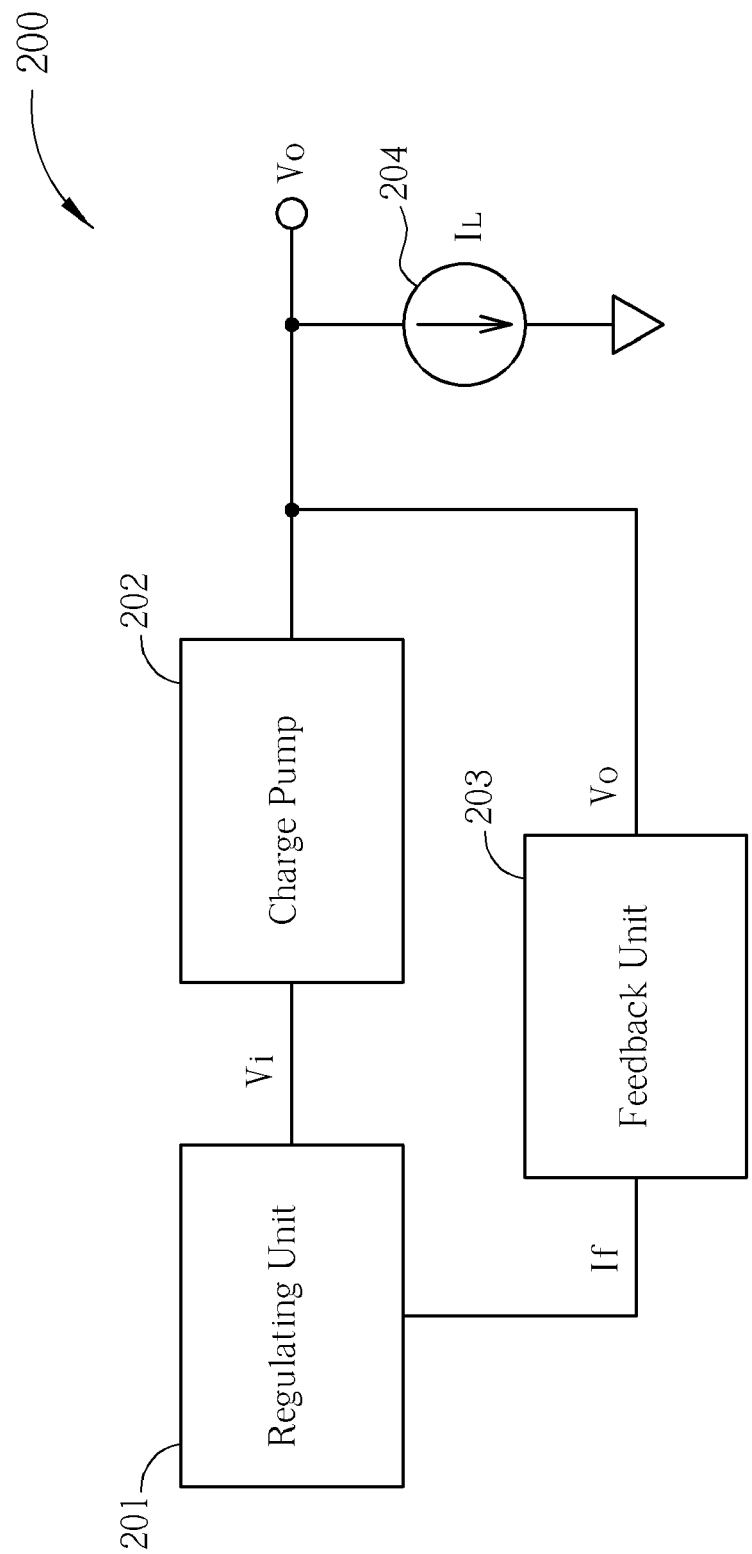
FIG. 7 illustrates a diagram of a voltage conversion device of the present invention capable of enhancing voltage conversion efficiency.

Please refer to FIG. 7, which illustrates a schematic diagram of a voltage conversion device 200 according to the present invention. The voltage conversion device 200 can enhance voltage conversion efficiency, and includes a charge pump 202, a regulating unit 201, and a feedback unit 203, to transform an input voltage Vi into an output voltage Vo. The charge pump 202 can be any type of charge pump, for multiplying the input voltage Vi into a specific multiplication output voltage Vo. The feedback unit 203 is coupled to the charge pump 202, for outputting a feedback signal If to the regulating unit 201 according to the output voltage Vo of the charge pump 202. The regulating unit 201 outputs and adjusts the input voltage Vi according to the feedback signal If outputted from the feedback unit 203, so that the output voltage Vo of the charge pump 202 keeps in an expected level. Moreover, in FIG. 7, a current $I_L$ generated from an equivalent current source 204 represents the load current of the charge pump 202.

The feedback unit 203 of the voltage conversion device 200 can generate the feedback signal If according to the voltage Vo outputted from the charge pump 202, and the regulating unit 201 can adjust the input voltage Vi accordingly, so that the voltage Vo remains at a preset level. Preferably, the feedback signal If is a forward or inverse current. When the load current $I_L$ increases and causes the output voltage Vo to drop, the current value of the feedback signal If increases, and the level of the input voltage Vi outputted from the regulating unit 201 is elevated, to keep the output voltage Vo of the charge pump 202 at the expected level. In other words, when the load current $I_L$ changes, the voltage Vi outputted from the regulating unit 201 is automatically adjusted due to the change of the current flowing through the feedback route, so as to keep the output voltage Vo of the charge pump 202 at an expected level.

In short, the present invention voltage conversion device 200 automatically adjusts the output voltage of the charge pump through a voltage-to-current feedback control method, so as to keep the output voltage of the charge pump at an expected level under circumstances of different switch-on resistances and different currents. As a result, the present invention does not need an extra voltage stabilization capacitor or voltage regulator, and can reduce efficiency waste.

Note that, the voltage conversion device 200 shown in FIG. 7 is a diagram of an embodiment of the present invention, and those skilled in the art can design circuits accordingly. The followings explain embodiments of the regulating unit 201 and the feedback unit 203 under different applications. A voltage VDD represents a system voltage, voltages V3, V4, V6, V7 represent specific direct current voltages, and GND represents a ground end.

Firstly, when the polarities of the output voltage Vo and the input voltage Vi are the same, the feedback signal If outputted from the feedback unit 203 can either flow from the feedback unit 203 to the regulating unit 201, or flow from the regulating unit 201 to the feedback unit 203. Please refer to FIG. 8, which illustrates a schematic diagram of a regulating unit 800. The regulating unit 800 is an embodiment of the regulating unit 201 shown in FIG. 7, which is applicable when the output voltage Vo and the input voltage Vi have the same polarities and the feedback signal If is an inverse current (flown out from the regulating unit 800). The regulating unit 800 includes a voltage output end 802, a feedback end 804, an operational amplifier 301, a p-type metal oxide semiconductor transistor (PMOS transistor) P30 and resistors R31, R32. The regulating unit 800 can output the voltage Vi through the voltage output end 802, and receive the feedback signal If (output current) through the feedback end 804. The negative input end of the operational amplifier 301 is coupled to a reference voltage Vr, the positive input end is coupled to the resistors R31, R32 and the feedback end 804, and the output end is coupled to a gate of the PMOS transistor P30. Utilizing the regulating unit 800, when the output voltage Vo of the charge pump 202 decreases, the current value of the feedback signal If increases, so that the current flowing through the resistor R31 increases, causing the voltage Vi to arise. When the output voltage Vo of the charge pump 202 resumes to an preset value, the current value of the feedback signal If decreases, so that the current flowing through the resistor R31 decreases and the voltage Vi resumes to the set value.

The regulating unit 800 is applicable when the output voltage Vo and the input voltage Vi have the same polarities and the feedback signal If flows out from the regulating unit 800, and there are many embodiments of the corresponding feedback unit 203. Please refer to FIG. 9, which illustrates a schematic diagram of a feedback unit 900. The feedback unit 900 realizes the feedback unit 203, which operates with the regulating unit 800. The feedback unit 900 comprises an output voltage reception end 902, a feedback signal end 904, a voltage division circuit 906, and a voltage to current conversion circuit 908. The voltage division circuit 906 receives the output voltage Vo from the charge pump 202 through the output voltage reception end 902, in order to generate a division voltage to the voltage to current conversion circuit 908, so as to generate the feedback signal If (inverse current) through the feedback signal end 904.

Figure 8:
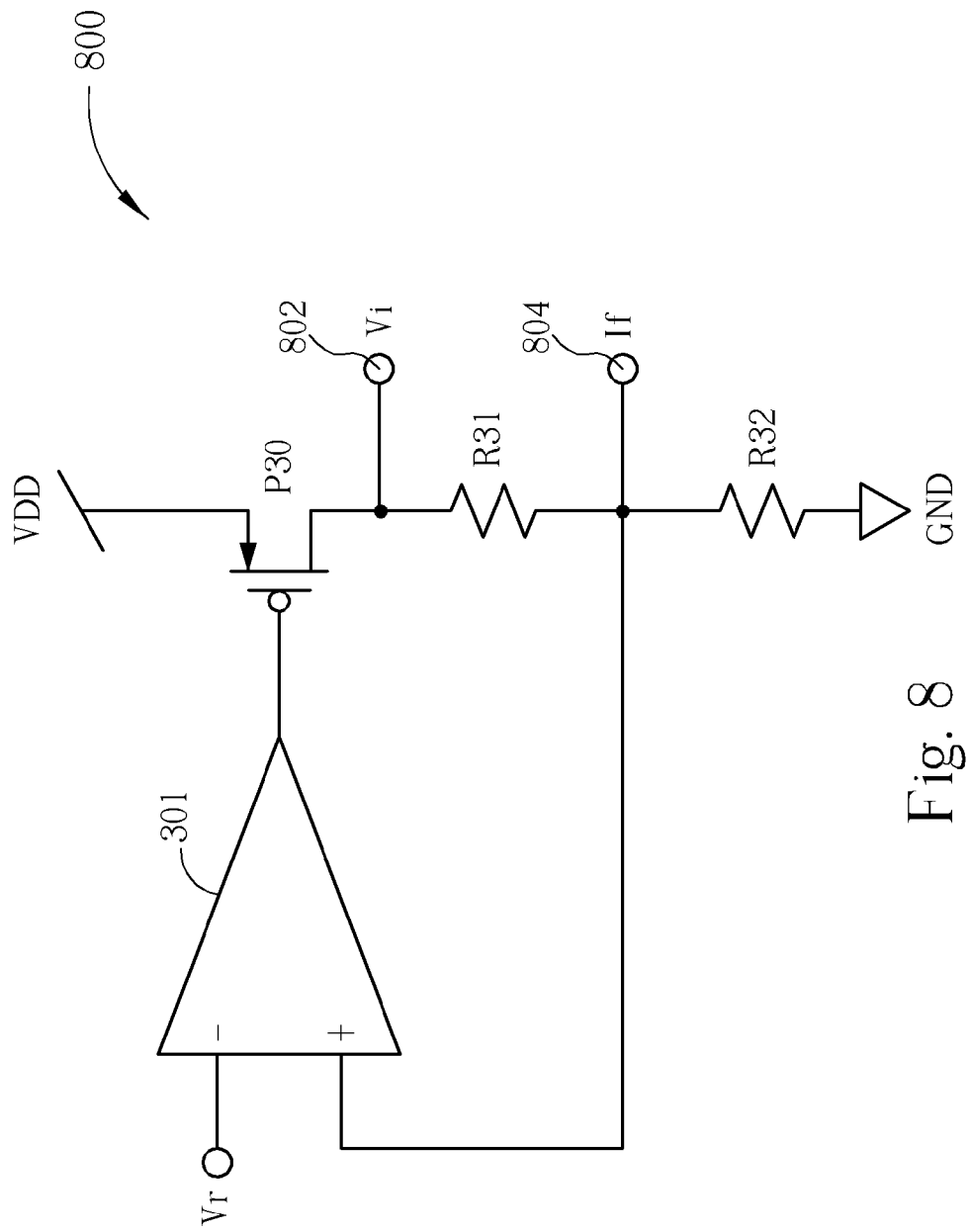
FIG. 8 illustrates a schematic diagram of a regulating unit of an embodiment of the present invention.
Figure 9:
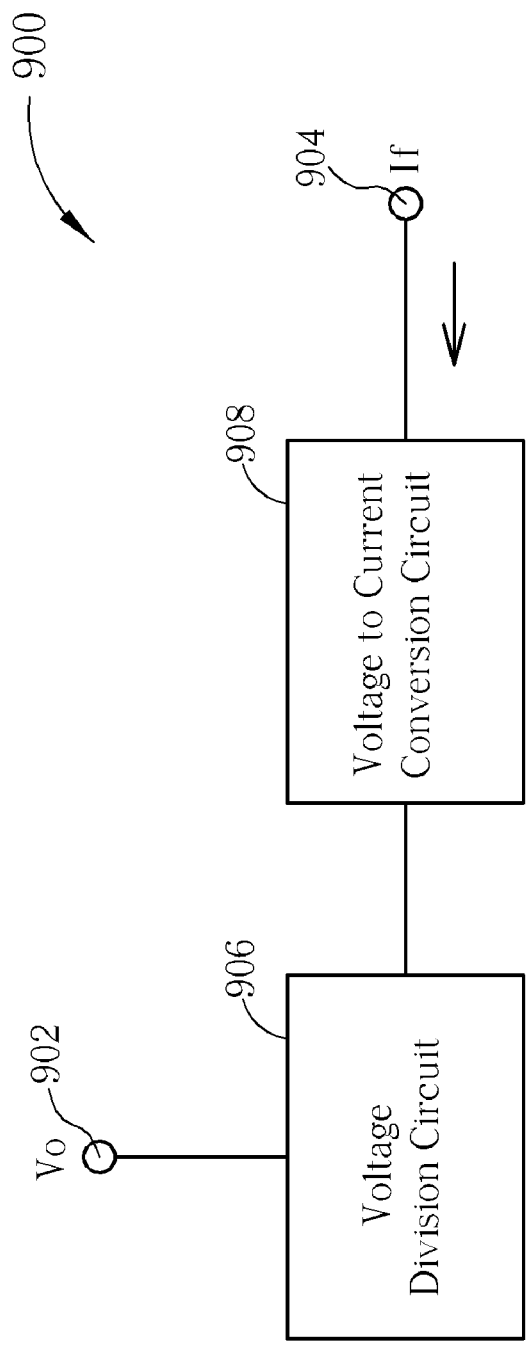
FIG. 9 illustrates a schematic diagram of a feedback unit of an embodiment of the present invention.
Figure 10:
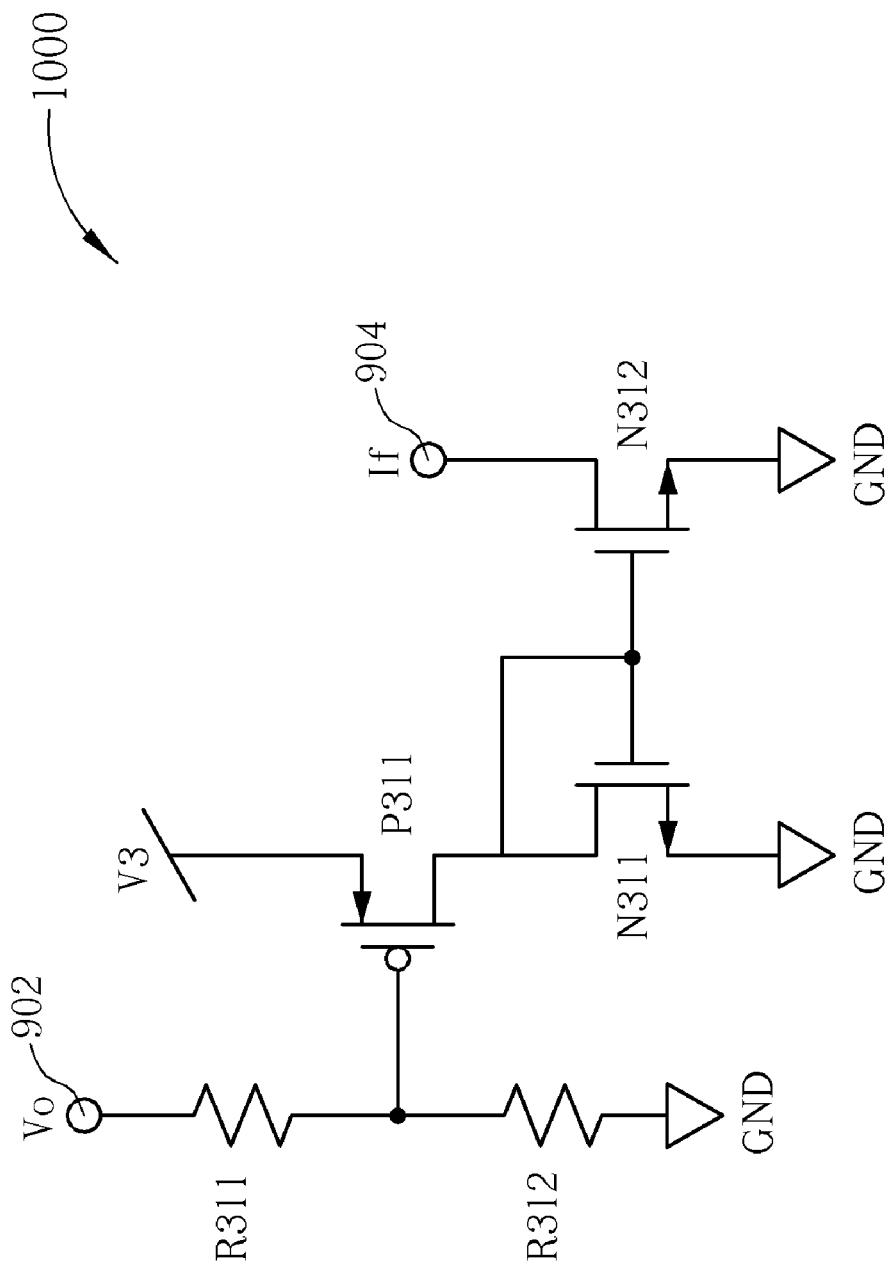
FIGS. 10-13 illustrate schematic diagrams of circuits of a feedback unit shown in FIG. 9.

Please further refer to FIG. 10-13, which illustrate schematic diagrams of circuits 1000, 1100, 1200, 1300. The circuits 1000, 1100, 1200, 1300 are utilized to realize the feedback unit 900 in FIG. 9. In FIG. 10, resistors R311, R312 realize the voltage division circuit 906, a PMOS transistor P311 is the voltage to current amplifier, and n-type metal oxide semiconductor transistors (NMOS transistors) N311, N312 form a current mirror, in order to realize the voltage to current conversion circuit 908, with an operation method narrated as the followings. The voltage Vo is divided by the resistors R311, R312 and utilizes the PMOS transistor P311 to switch on a certain current, and the current is drawn through the current mirror formed by the NMOS transistors N311, N312, to generate the feedback signal If. When the load current $I_L$ of the output voltage Vo of the charge pump 202 increases and causes the output voltage Vo to decrease, the gate voltage of the PMOS transistor P311 decreases correspondingly. Due to an increase of the voltage difference between the source and gate of the PMOS transistor P311, the switch-on current increases accordingly, and the current value of the feedback signal If also increases, so that the voltage Vi outputted from the regulating unit 800 in FIG. 8 increases, and the output voltage Vo of the charge pump 202 increases accordingly. Finally, the regulating unit 800 automatically adjusts the output voltage Vi until the output voltage Vo of the charge pump 202 increases to a preset value. On the other hand, when the load current $I_L$ of the output voltage Vo of the charge pump 202 decreases and causes the output voltage Vo to increase, the gate voltage of the PMOS transistor P311 increases correspondingly. Due to a decrease of a voltage difference between the source and gate of the PMOS transistor P311, the switch-on current decreases accordingly, and the current value of the feedback signal If also decreases.

The current drop of the feedback signal If decreases the voltage Vi outputted from the regulating unit 800, and can decrease the output voltage Vo of the charge pump 202. Eventually, the regulating unit 800 automatically adjusts the output voltage Vi until the output voltage Vo of the charge pump 202 decreases to a preset value. Hence, when the output voltage Vo of the charge pump 202 varies with the load current $I_L$, the regulating unit 800 and the circuit 1000 can automatically resume the output voltage Vo of the charge pump 202 to the preset value, and are not affected by the switch-on resistor effect or different load currents. In other words, the regulating unit 800 and the circuit 1000 can provide similar steady voltages without an extra voltage regulator or a voltage stabilization capacitor, so as to prevent efficiency loss.

Figure 11:
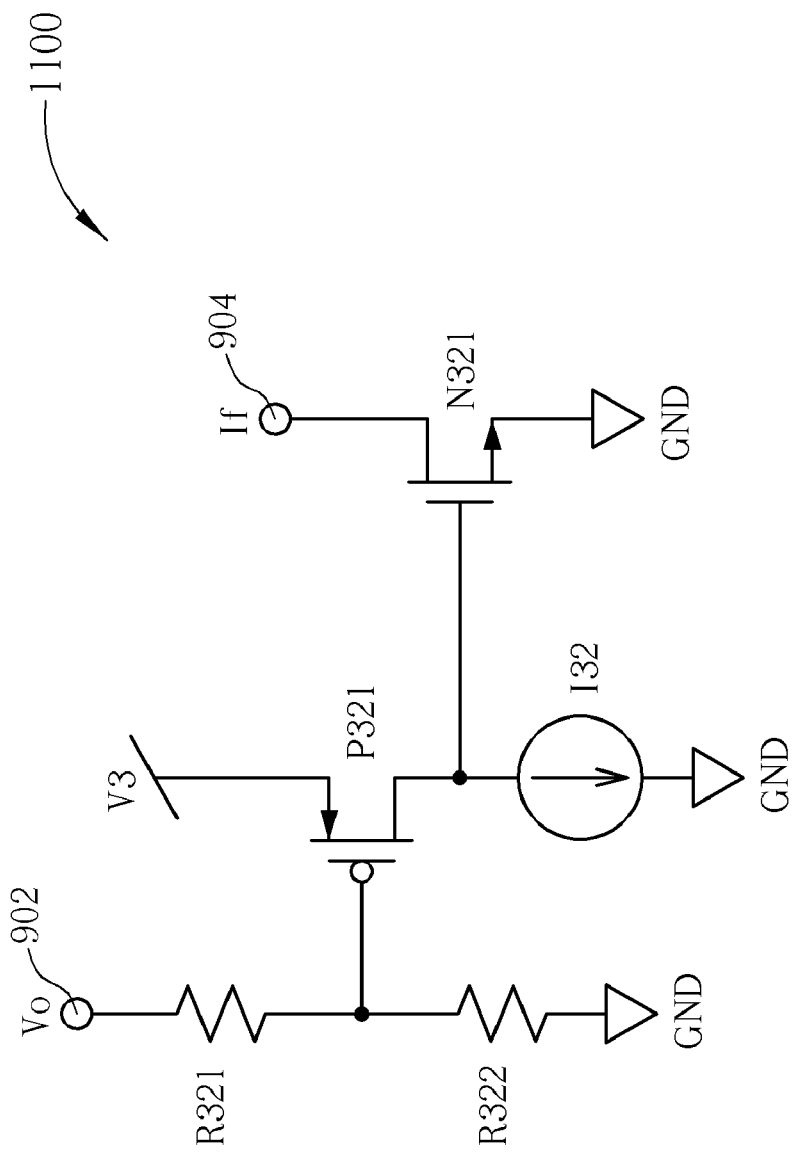

In FIG. 11, resistors R321, R322 realize the voltage division circuit 906 in FIG. 9, and a PMOS transistor P321, an NMOS transistor N321 and a current source 132 realize the voltage to current conversion circuit 908 in FIG. 9, with an operation method narrated as the follows. The voltage Vo is divided by the resistors R321, R322 and utilizes the PMOS transistor to switch on a specific current. The current source 132 biases the PMOS transistor P321. The common node of the drain of the PMOS transistor P321 and the current source 132 is coupled to the gate of the NMOS transistor N321, and draws current from the drain of the NMOS transistor, in order to generate the feedback signal If. When the load current $I_L$ of the output voltage Vo of the charge pump 202 increases and causes the output voltage Vo to decrease, the gate voltage of the PMOS transistor P321 decreases; thus, the gate voltage of the NMOS transistor N321 increases, and the current value of the feedback signal If also increases. The raise of the current value of the feedback signal If increases the voltage Vi of the regulating unit 800 shown in FIG. 8, and increases the output voltage Vo of the charge pump 202. Finally, the regulating unit 800 can automatically adjust the voltage Vi until the output voltage Vo of the charge pump 202 rises to the preset value. On the other hand, when the load current $I_L$ of the output voltage Vo of the charge pump 202 decreases and causes the output voltage Vo to increase, the gate voltage of the PMOS transistor P321 increases; thus, the gate voltage of the NMOS transistor N321 decreases, and the current value of the feedback signal If also decreases. And the drop of the current value of the feedback signal If decreases the voltage Vi outputted from the regulating unit 800, and also decreases the output voltage Vo of the charge pump 202. In the same way, the regulating unit 800 regulates the voltage Vi automatically until the output voltage Vo of the charge pump 202 decreases to the preset value.

Figure 12:
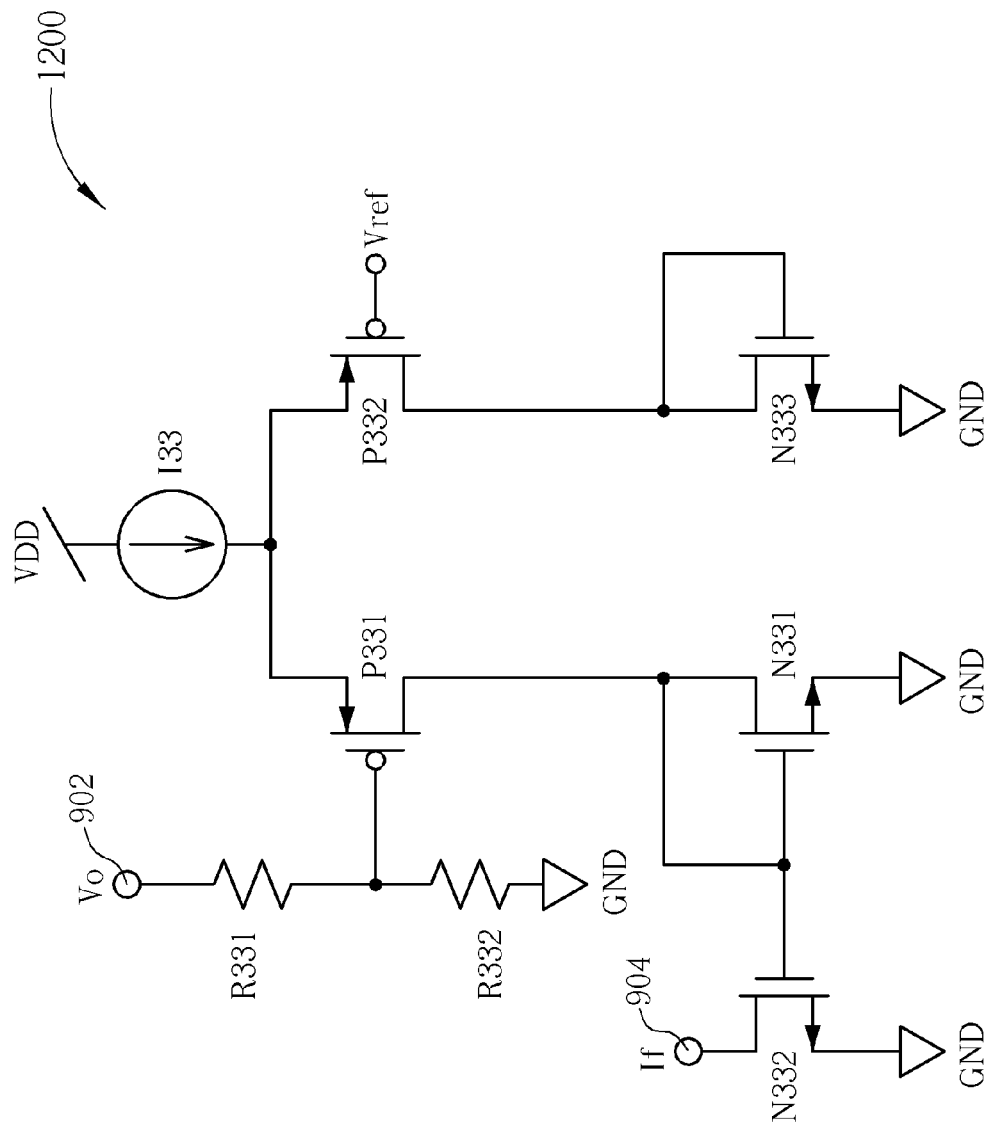

In FIG. 12, resistors R331, R332 realize the voltage division circuit 906 in FIG. 9. PMOS transistors P331, P332 form a differential amplifier, NMOS transistors N331, N332 form a current mirror, and an NMOS transistor N333 forms an active load. The PMOS transistors P331, P332 and the NMOS transistors N331, N332, N333 are used for realizing the voltage to current conversion circuit 908 in FIG. 9, with an operation method narrated as the followings. The common node of the resistors R331, R332 are coupled to a gate of the PMOS transistor P331, and a gate of the PMOS transistor P332 is coupled to a reference voltage Vref. When the load current $I_L$ of the output voltage Vo of the charge pump 202 increases and causes the output voltage Vo to decrease, the gate voltage of the PMOS transistor P331 decreases; thus, current generated from the current source 133 flowing through the PMOS transistor P331 increases. With the current mirror formed by the NMOS transistors N331, N332, the current value of the feedback signal If increases. The current raise of the feedback signal If increases the voltage Vi outputted from the regulating unit 800 shown in FIG. 8, and increases the output voltage Vo of the charge pump 202. Finally, the regulating unit 800 automatically regulates the voltage Vi until the output voltage Vo of the charge pump 202 rises to the preset value. On the other hand, when the load current $I_L$ of the output voltage Vo of charge pump 202 decreases and causes the output voltage Vo to increase, the gate voltage of the PMOS transistor P331 increases, so that more of the current from the current source 133 flows through the PMOS transistor P332 and the NMOS transistor N333, and the current flowing through the PMOS transistor P331 decreases. After reflected by the current mirror formed by the NMOS transistors N331, N332, the current value of the feedback signal If decreases. The current drop of the feedback signal If decreases the voltage Vi outputted from the regulating unit 800, and decreases the output voltage Vo of the charge pump 202. In the same way, the regulating unit 800 eventually regulates the output voltage Vi automatically until the output voltage Vo of the charge pump 202 decreases to the preset value.

Figure 13:
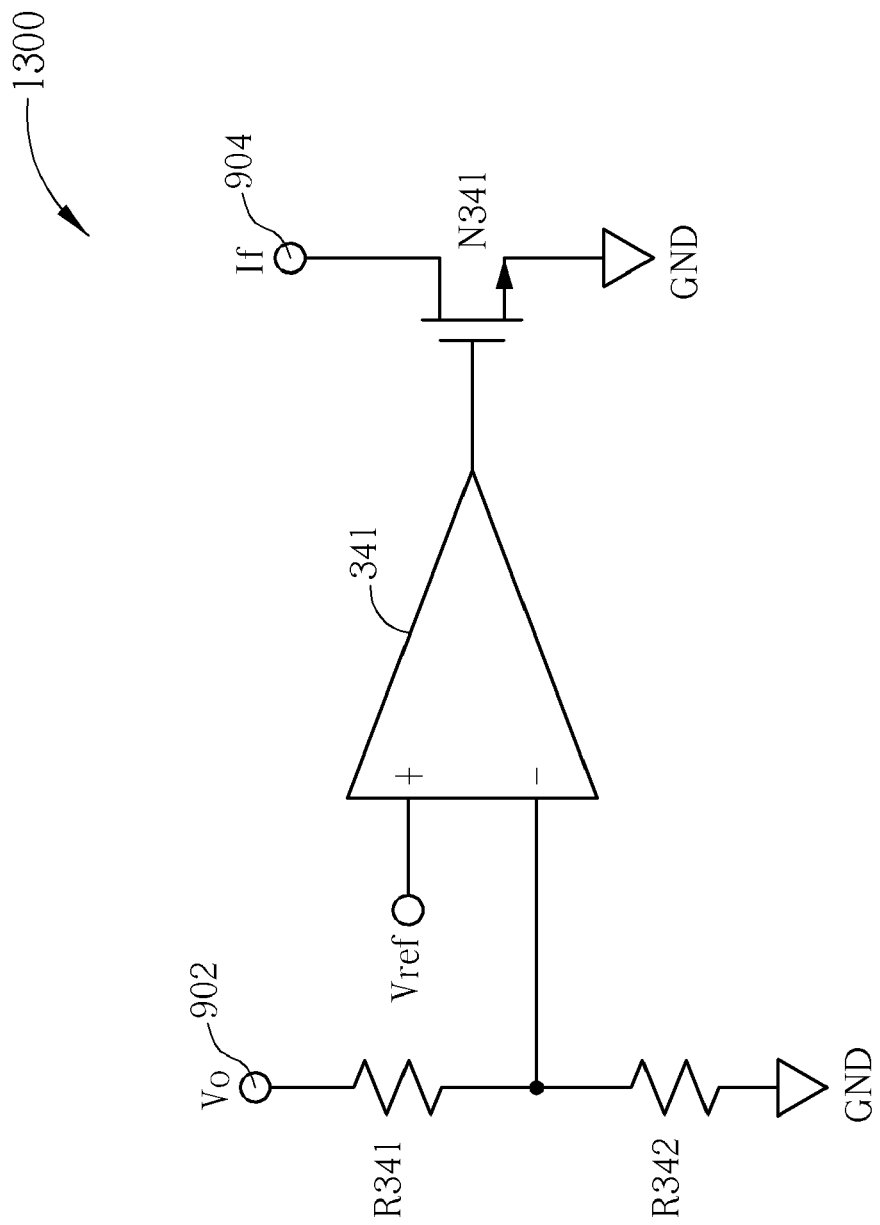

In FIG. 13, resistors R341, R342 realize the voltage division circuit 906 in FIG. 9, and an operational amplifier 341 and an NMOS transistor N341 realize the voltage to current conversion circuit 908 in FIG. 9, with an operation method narrated as the followings. The voltage Vo is divided by the resistors R341, R342, and is coupled to the negative input end of the operational amplifier 341, while the positive input end of the operational amplifier 341 is coupled to a reference voltage Vref, and the output end of the operational amplifier 341 is coupled to the gate of the NMOS transistor N341. When the load current $I_L$ of the output voltage Vo of the charge pump 202 increases and causes the output voltage Vo to decrease, the gate voltage of the NMOS transistor N341 increases; thus, the current value of the feedback signal If generated from the drain of the NMOS transistor N341 increases. The current raise of the feedback signal If increases the voltage Vi outputted from the regulating unit 800 in FIG. 8, which makes the output voltage Vo of the charge pump 202 increase. Finally, the regulating unit 201 automatically adjusts the output voltage Vi until the output voltage Vo of the charge pump 202 rises to a preset value. On the other hand, when the load current $I_L$ of the output voltage Vo of the charge pump 202 decreases and causes the output voltage Vo to increase, the gate voltage of the NMOS transistor N341 decreases, so that the current generated from the drain of the NMOS transistor N341 decreases. The drop of the current value of the feedback signal If decreases the voltage Vi outputted from the regulating unit 800 shown in FIG. 8, and can decrease the output voltage Vo of the charge pump 202. In the same way, the regulating unit 800 eventually regulates the voltage Vi automatically until the output voltage Vo of the charge pump 202 drops to the preset value.

Note that the regulating unit 800 shown in FIG. 8 and the feedback unit 900 shown in FIG. 9 are applicable when the output voltage Vo and the input voltage Vi have the same polarities and the feedback signal If is an inverse current (flown from the regulating unit 800 to the feedback unit 900). FIGS. 10-13 are embodiments of the feedback unit 900. Moreover, the present invention further provides other embodiments for conditions when the feedback signal If is forward current.

Figure 14:
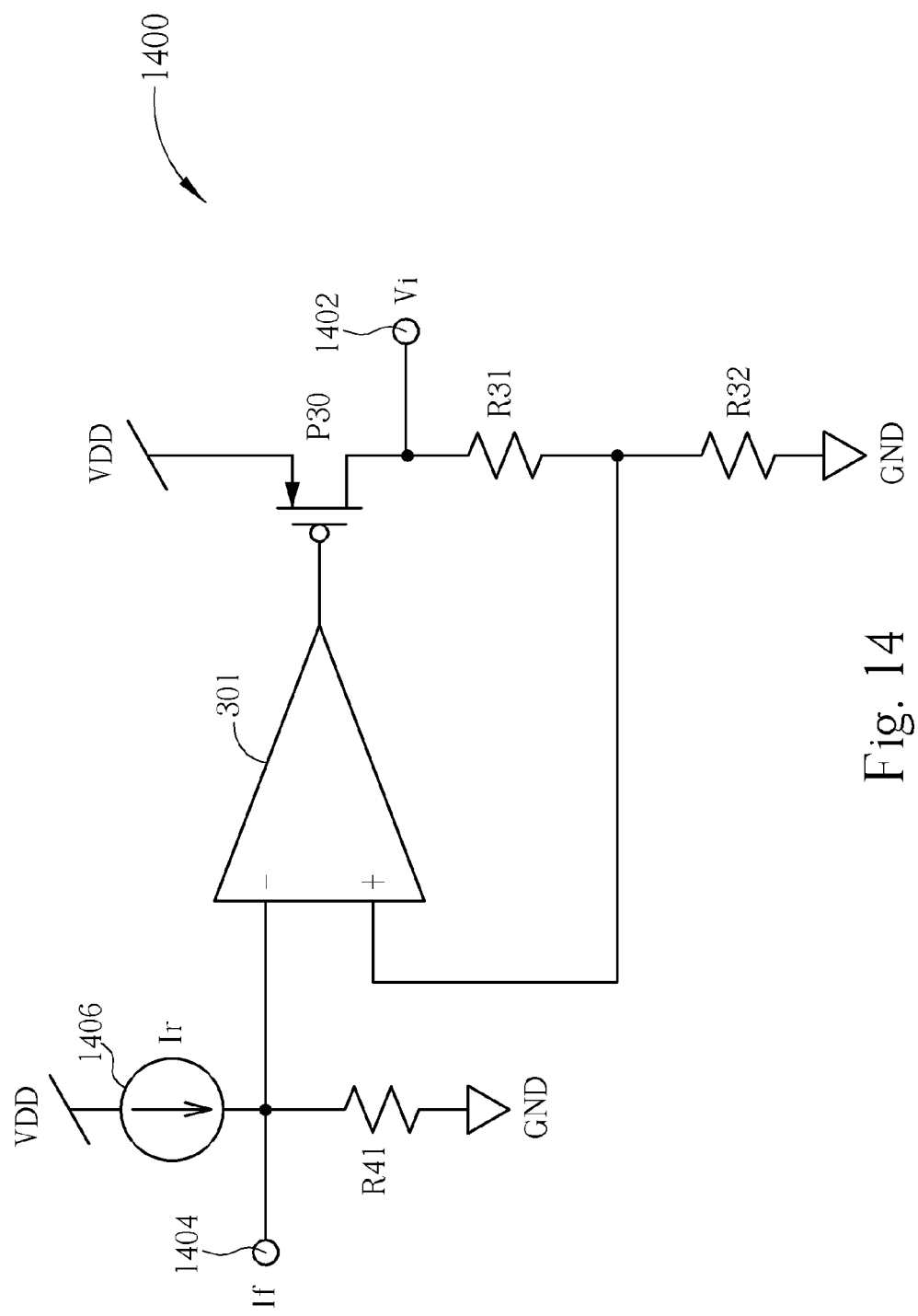
FIG. 14 illustrates a schematic diagram of a regulating unit of an embodiment of the present invention.

Please refer to FIG. 14, which is a schematic diagram of a regulating unit 1400. The regulating unit 1400 is an embodiment of the regulating unit 201 shown in FIG. 7, which is applicable when the output voltage Vo and the input voltage Vi have the same polarities and the feedback signal If is an forward current (flowing into the regulating unit 1400). A circuit structure of the regulating unit 1400 resembles the regulating unit 800 in FIG. 8, but adds a current source 1406 and a resistor R41, and a feedback end 1404 is moved to the negative input end of the operational amplifier 301 (leaving out the reference voltage Vr), with an operation method narrated as the followings. When the output voltage Vo of the charge pump 202 decreases, the current value of the received feedback signal If increases, so that the current flowing through the resistor R41 increases, raising the drain current of a PMOS transistor P30, and so does the voltage Vi outputted from the voltage output end 1402. When the output voltage Vo of the charge pump 202 resumes to a preset value, the current value of the feedback signal If decreases, and the current flowing through the resistor R41 decreases, so that the voltage Vi resumes to the preset value.

The regulating unit 1400 is applicable when the output voltage Vo and the input voltage Vi have the same polarities and the feedback signal If current flows into the regulating unit 201, while there are many embodiments of the corresponding feedback unit 203. Please refer to FIG. 15, which illustrates a schematic diagram of a feedback unit 1500. The feedback unit 1500 is utilized for realizing the feedback unit 203, which coordinates with the regulating unit 1400. The feedback unit 1500 comprises an output voltage reception end 1502, a feedback signal end 1504, a voltage division circuit 1506, and a voltage to current conversion circuit 1508. The voltage division circuit 1506 receives the output voltage Vo from the charge pump 202 through the output voltage reception end 1502 to generate a divided voltage to the voltage to current conversion circuit 1508, so as to generate a feedback signal If (forward current) through the feedback signal end 1504.

Figure 15:
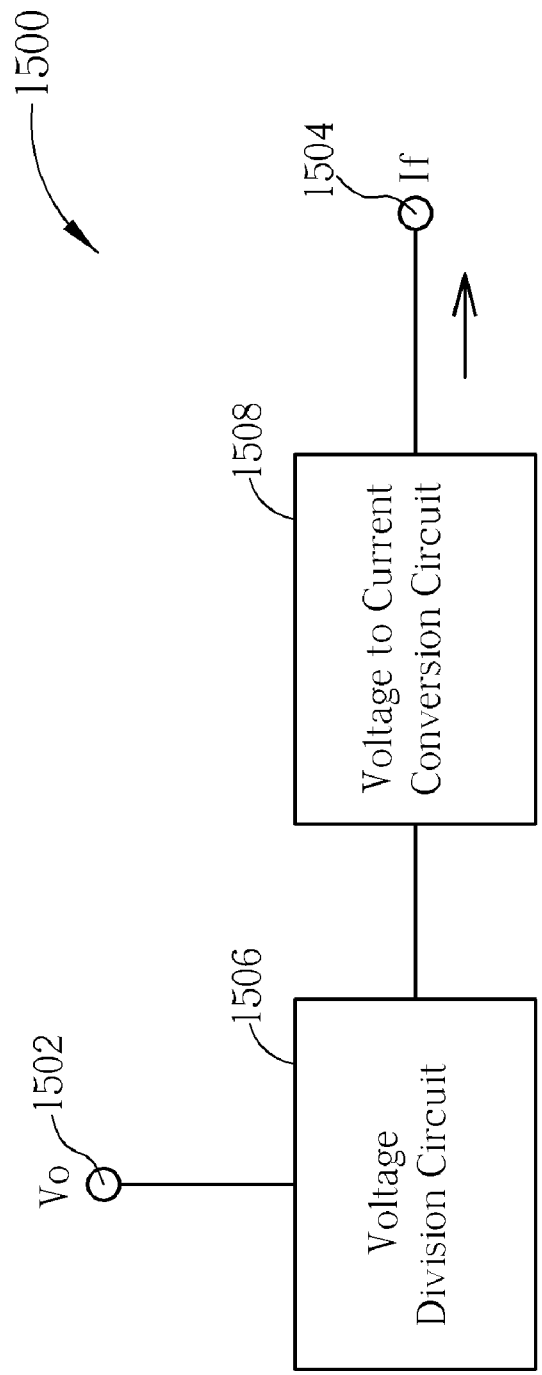
FIG. 15 illustrates a schematic diagram of a feedback unit of an embodiment of the present invention.
Figure 16:
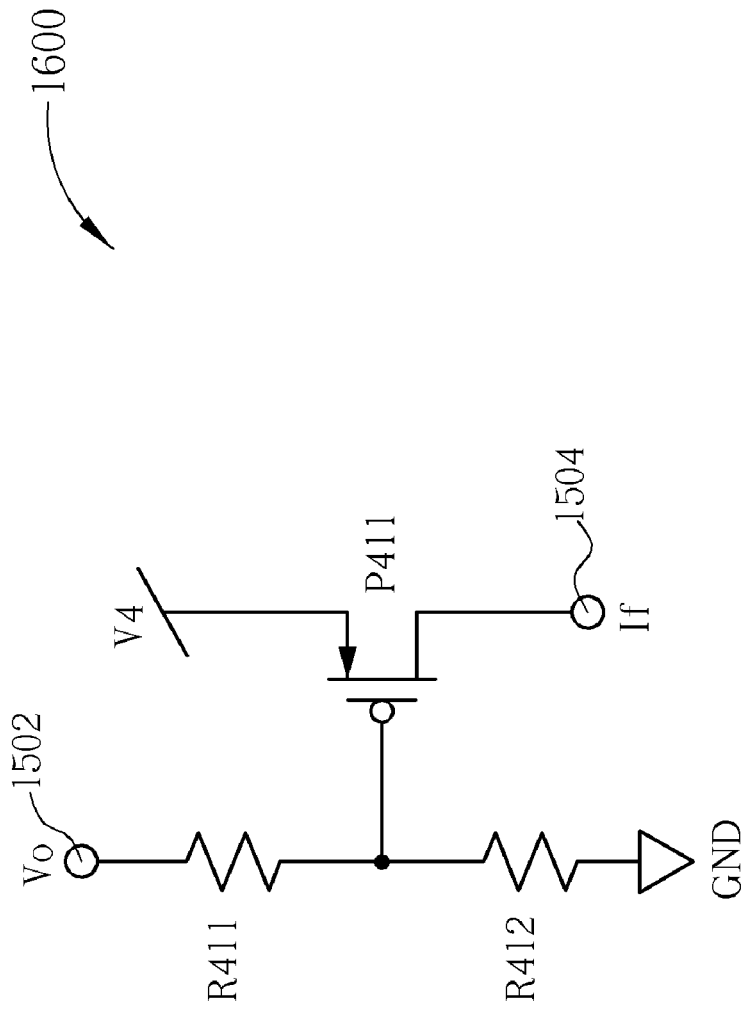
FIGS. 16-20 illustrate schematic diagrams of circuits of embodiments for realizing the feedback unit shown in FIG. 15.

Please further refer to FIGS. 16-20, which illustrate schematic diagrams of circuits 1600, 1700, 1800, 1900, and 2000. The circuits 1600, 1700, 1800, 1900, 2000 realize the feedback unit 1500 shown in FIG. 15. In FIG. 16, resistors R411, R412 realize the voltage division circuit 1506, and a PMOS transistor P411 realizes the voltage to current conversion circuit 1508, with an operating method narrated as the followings. The voltage Vo is divided by the resistors R411, R412 to utilize the PMOS transistor P411 to switch on a certain current, and output the current through a drain of the PMOS transistor P411, which is the feedback signal If. When the load current $I_L$ of the output voltage Vo of the charge pump 202 increases and causes the output voltage Vo to decrease, the gate voltage of the PMOS transistor P411 decreases. Due to an increase of a voltage difference between the gate and the source of the PMOS transistor P411, the switch-on current increases, and the current value of the feedback signal $I_L$ also increases. The current raise of the feedback signal If increases the voltage Vi outputted from the regulating unit 1400 shown in FIG. 14, and raises the output voltage Vo of the charge pump 202. Finally, the regulating unit 1400 automatically regulates the output voltage Vi until the output voltage Vo of the charge pump 202 rises to the preset value. On the another hand, when the load current $I_L$ of the output voltage Vo of the charge pump 202 decreases and causes the output voltage Vo to increase, the gate voltage of the PMOS transistor P411 increases. Due to a decrease of a voltage difference between the gate and the source of the PMOS transistor P411, the switch-on current decreases, and the current value of the feedback signal If also decreases. The current drop of the feedback signal If decreases the voltage Vi outputted from the regulating unit 1400 shown in FIG. 14, and decreases the output voltage Vo of the charge pump 202. In the same way, the regulating unit 1400 eventually adjusts the output voltage Vi automatically until the output voltage Vo of the charge pump 202 drops to the preset value. Hence, when the output voltage Vo of the charge pump 202 varies with the load current $I_L$, the regulating unit 1400 and the circuit 1600 can automatically resume the output voltage Vo of the charge pump 202 to the preset value, and are not affected by the switch-on resistance effect or different load currents. In other words, without connecting to a voltage regulator or a voltage stabilization capacitor, the regulating unit 1400 and the circuit 1600 can provide a similar stable output voltage, in order to prevent efficiency loss.

Figure 1:
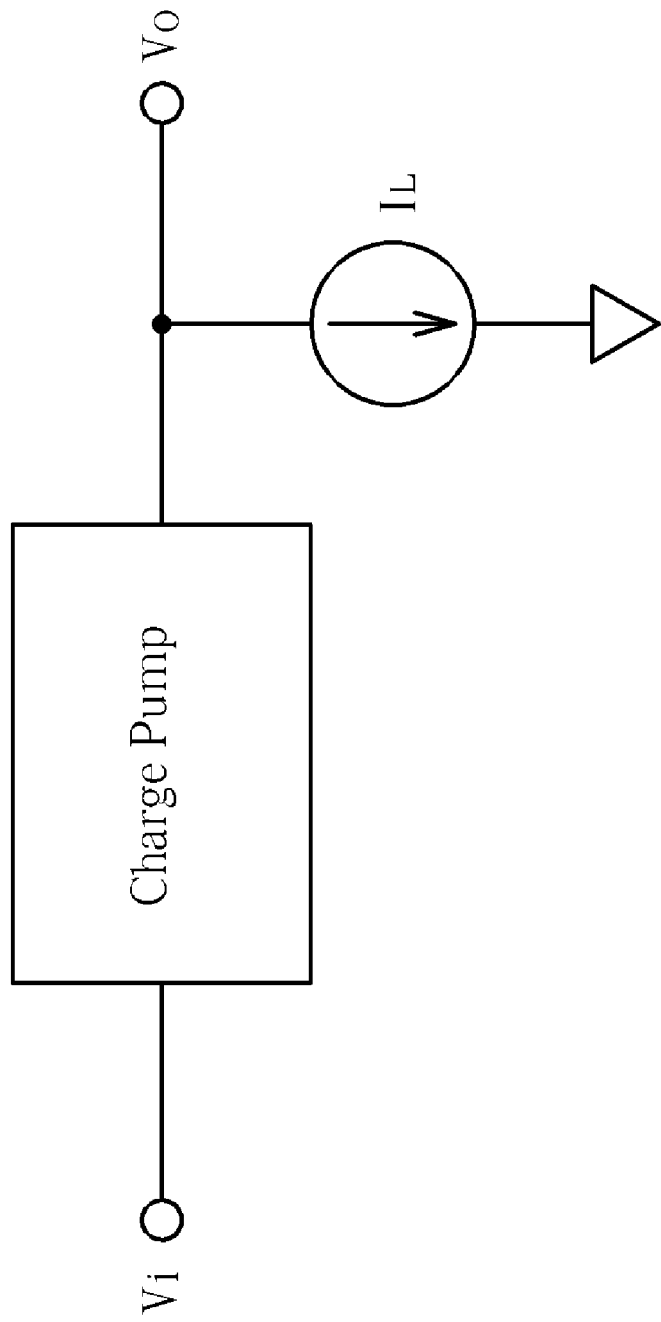
FIG. 1 illustrates a schematic diagram of a prior art charge pump for generating positive output voltages.
Figure 2:
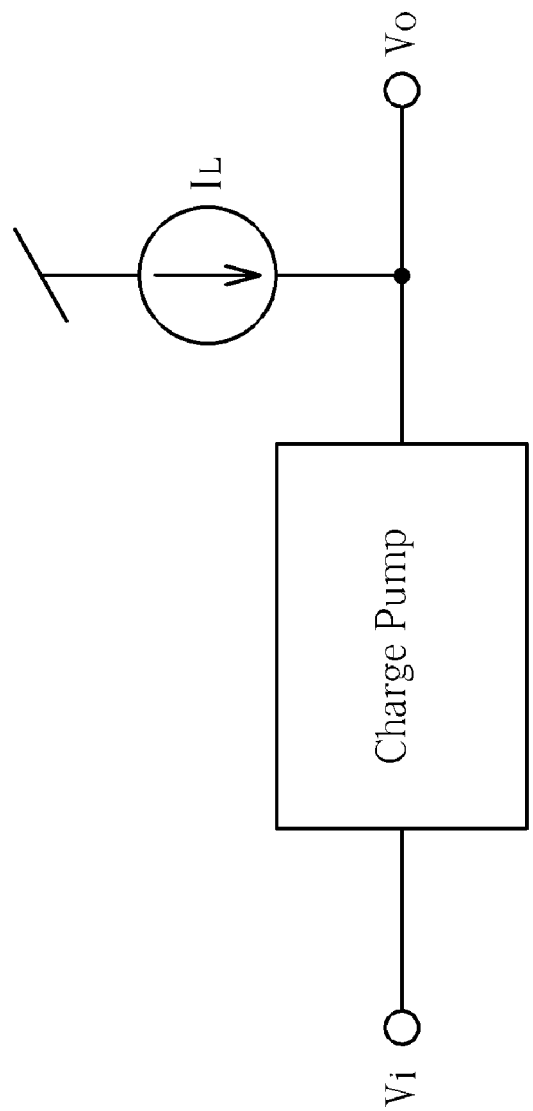
FIG. 2 illustrates a schematic diagram of a prior art charge pump for generating negative output voltages.
Figure 3:
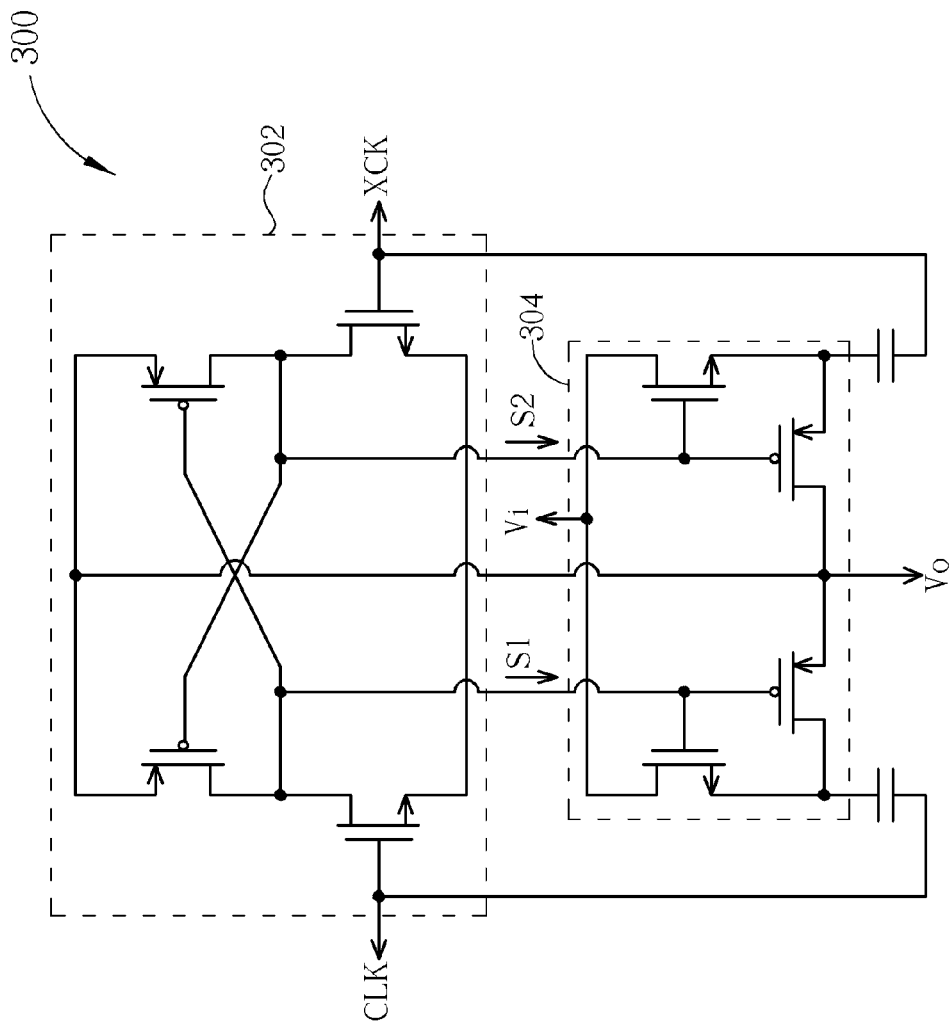
FIG. 3 illustrates a diagram of a prior art constant charge pump.
Figure 4:
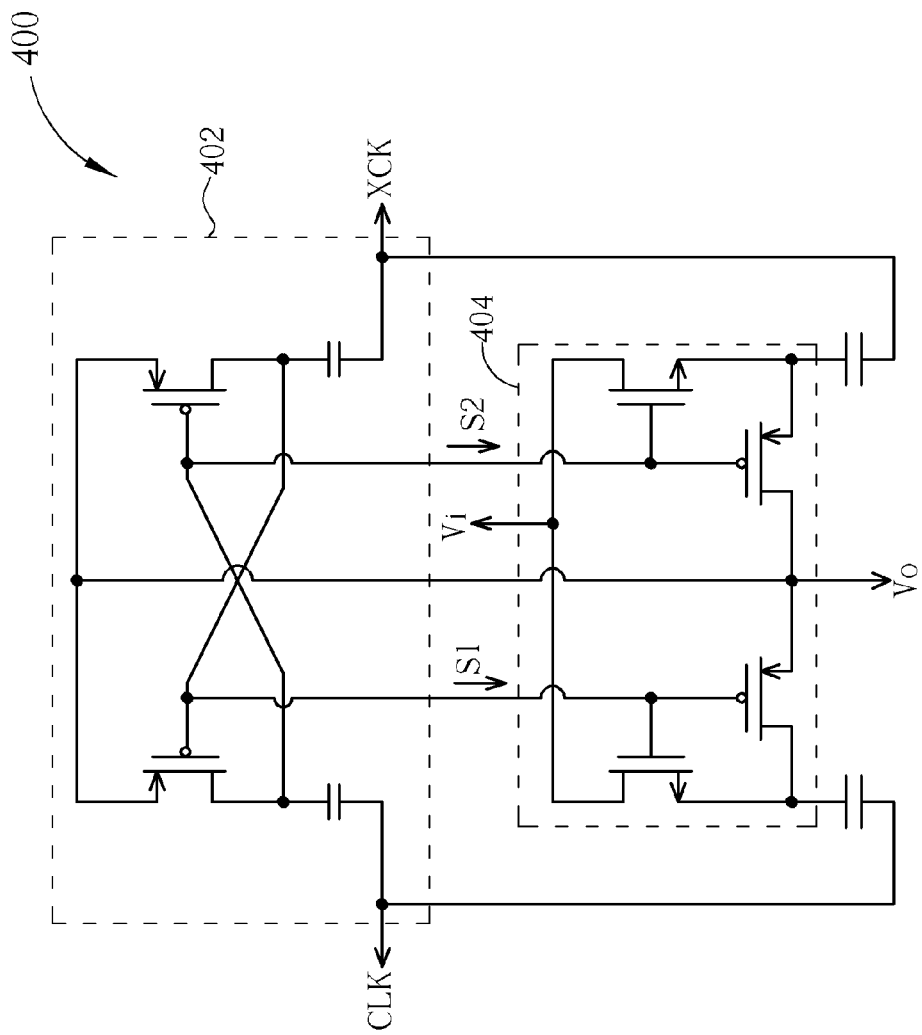
FIG. 4 illustrates a diagram of a prior art capacitor push-pull charge pump.
Figure 5:
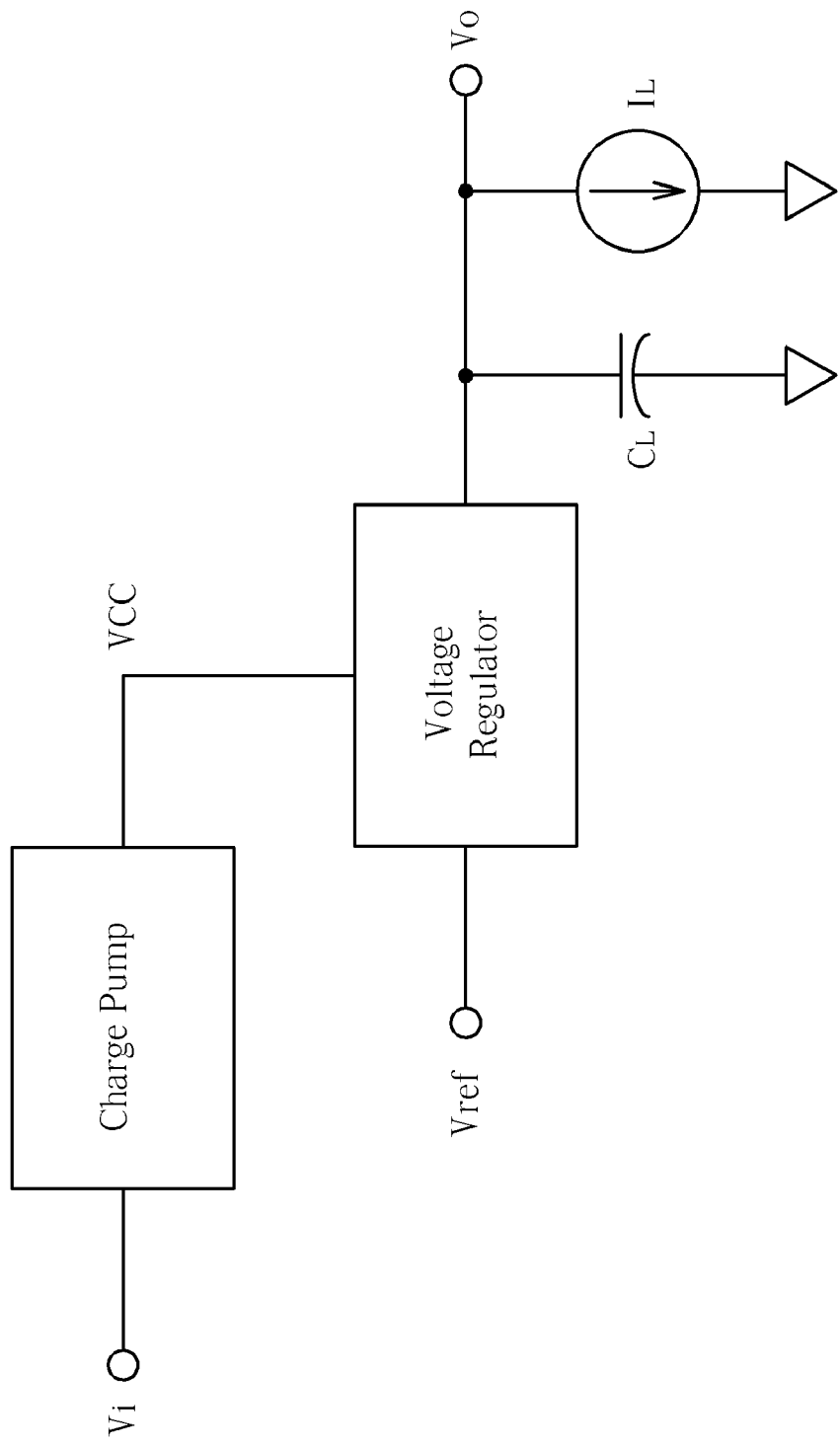
FIG. 5 illustrates a diagram of a prior art charge pump for generating positive output voltages coupled to a voltage regulator.
Figure 6:
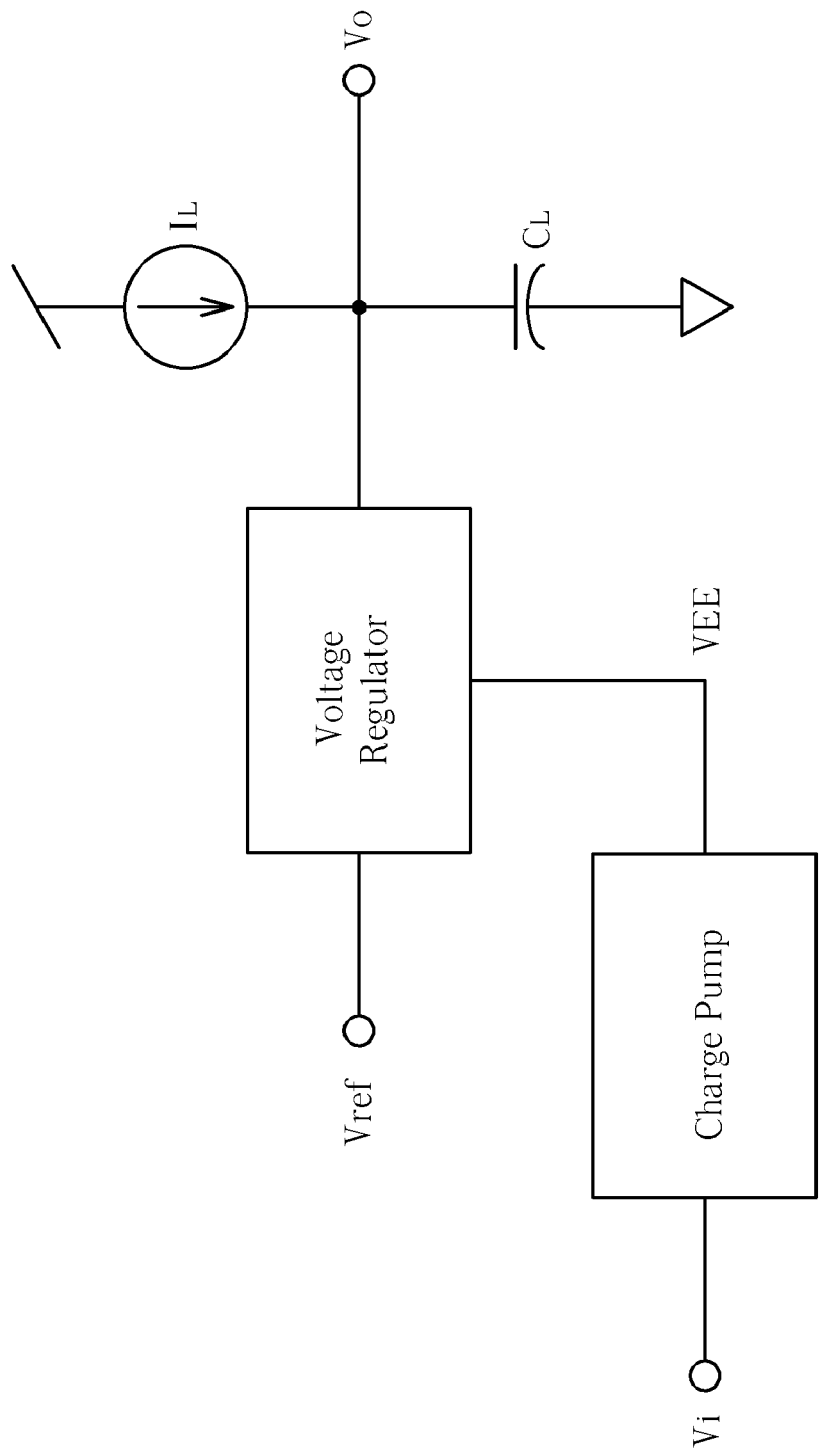
FIG. 6 illustrates a diagram of a prior art charge pump for generating negative output voltages coupled to a voltage regulator.
Figure 17:
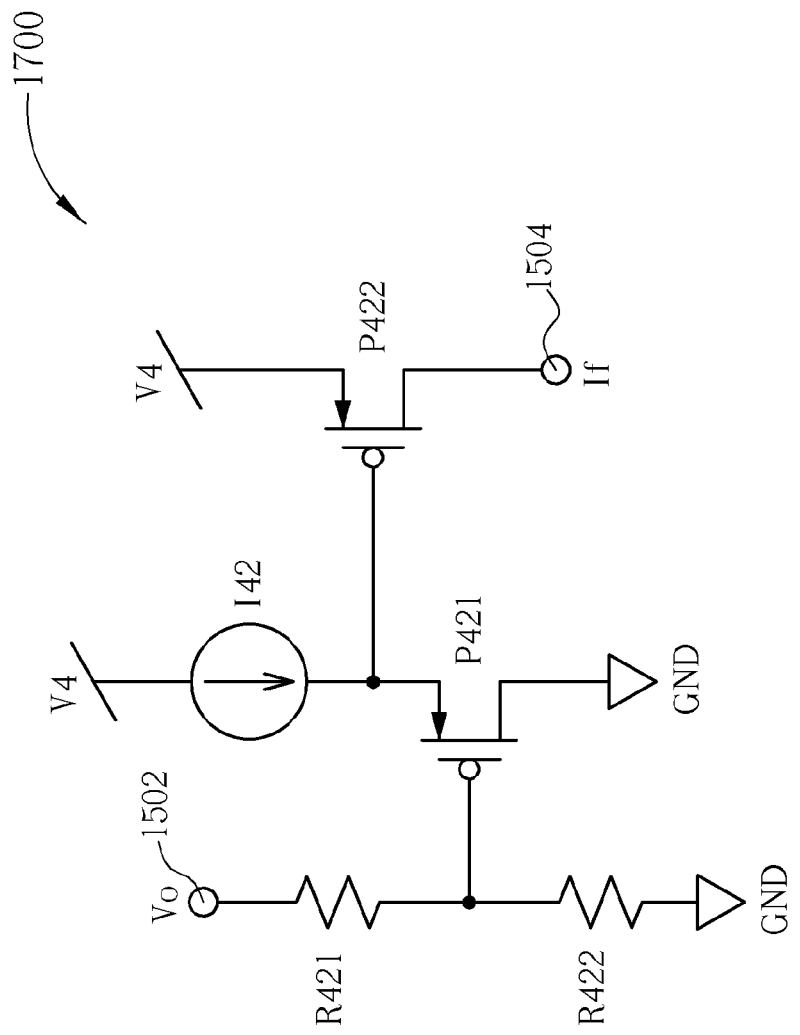

In FIG. 17, resistors R421, R422 realize the voltage division circuit 1506 shown in FIG. 5, and PMOS transistors P421, P422 and a current source 142 realize the voltage to current conversion circuit 1508 shown in FIG. 15, with an operating method narrated as the followings. The voltage Vo is coupled to the gate of the PMOS transistor P421 through the resistors R421, R422. The current source 142 biases the PMOS transistor P421. A common node of the source of the PMOS transistor P421 and the current source 142 is coupled to the gate of the PMOS transistor P422, and the current outputted from the drain of the PMOS transistor P422 is the feedback signal If. When the load current $I_L$ of the output voltage Vo of the charge pump 202 increases and causes the output voltage Vo to decrease, the gate voltage of the PMOS transistor P421 decreases; thus, the gate voltage of the PMOS transistor P422 decreases, and the current value of the feedback signal If rises. The current raise of the feedback signal If increases the voltage Vi outputted from the regulating unit 1400 shown in FIG. 14, and raises the output voltage Vo of the charge pump 202. Finally, the regulating unit 1400 automatically regulates the output voltage Vi until the output voltage Vo of the charge pump 202 rises to a preset value. On the other hand, when the load current $I_L$ of the output voltage Vo of the charge pump 202 decreases and causes the output voltage Vo to increase, the gate voltage of the PMOS transistor P421 increases, the gate voltage of the PMOS transistor P422 increases, and the current value of the feedback signal If decreases. The current drop of the feedback signal If decreases the voltage Vi outputted from the regulating unit 1400 shown in FIG. 14, and can decrease the output voltage Vo of the charge pump 202. In the same way, the regulating unit 1400 eventually regulates the output voltage Vi automatically until the output voltage Vo of the charge pump 202 drops to the preset value.

Figure 18:
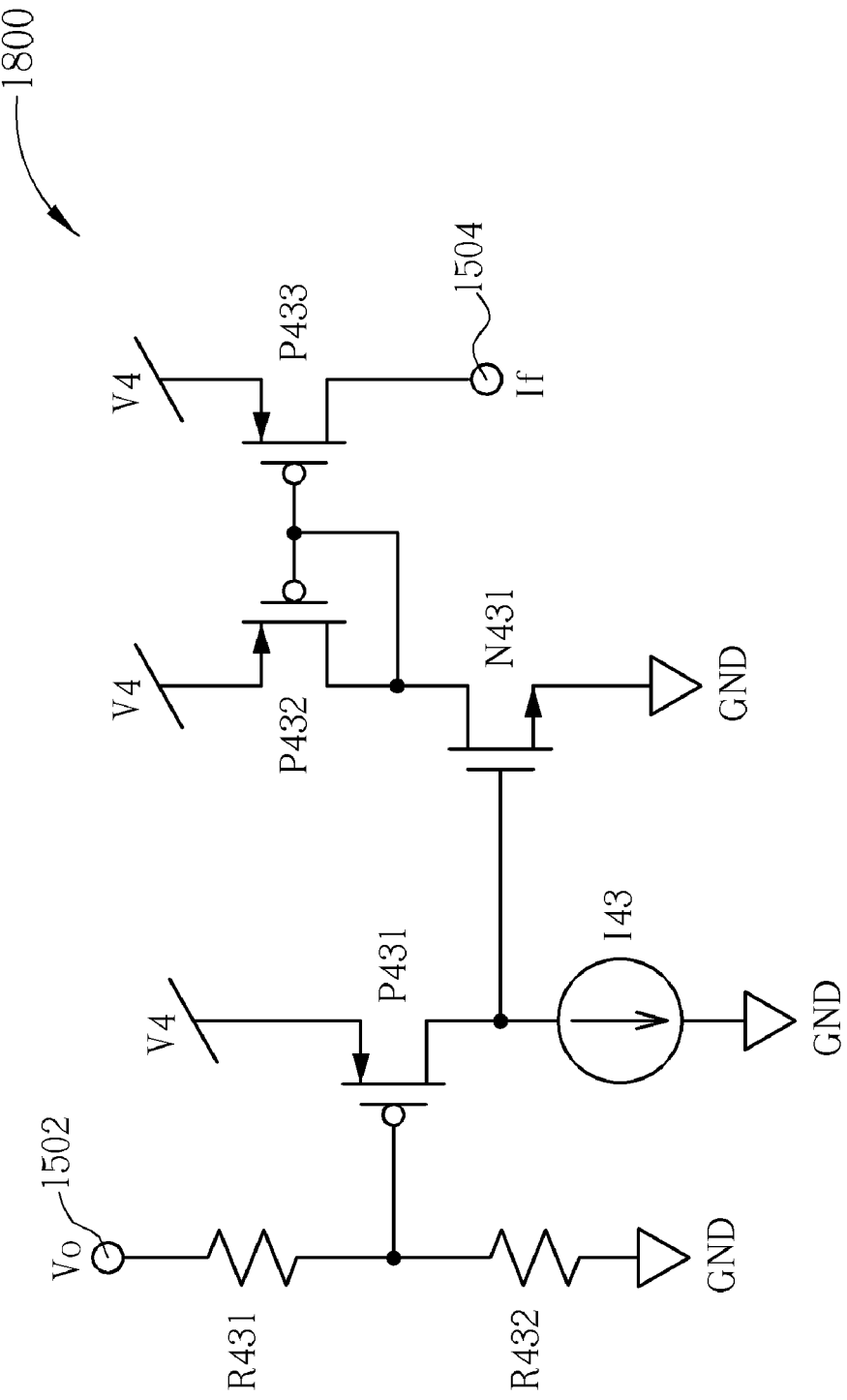

In FIG. 18, resistors R431, R432 realize the voltage division circuit 1506 shown in FIG. 15, and the voltage to current conversion circuit 1508 is realized by PMOS transistors P431, P432, P433, an NMOS transistor N431 and a current source 143, with an operation method narrated as the followings. The voltage Vo is divided by the resistors R431, R432, and is coupled to the gate of the PMOS transistor P431. The current source 143 biases the PMOS transistor P431. A common node of the drain of the PMOS transistor P431 and the current source 143 is coupled to the gate of the NMOS transistor N431, and the current flown through the drain of the NMOS transistor N431 then to the current mirror formed by the PMOS transistors P432, P433 is the feedback signal If. When the load current $I_L$ of the output voltage Vo of the charge pump 202 increases and causes the output voltage Vo to decrease, the gate voltage of the PMOS transistor P431 decreases, which raises the gate voltage of the NMOS transistor N431, and increases the current flowing through the current mirror formed by the PMOS transistors P432, P433, and the current value of the feedback signal If increases correspondingly. The current increase of the feedback signal If increases the voltage Vi outputted from the regulating unit 1400 shown in FIG. 14, and can raise the output voltage of the charge pump 202. Finally, the regulating unit 1400 automatically regulates the output voltage Vi until the output voltage Vo of the charge pump 202 rises to a preset value. One the other hand, when the load current $I_L$ of the output voltage Vo of the charge pump 202 decreases and causes the output voltage Vo to increase, the gate voltage of the PMOS transistor P431 increases, and the gate voltage of the NMOS transistor N431 decreases; thus, the current of the current mirror formed by the PMOS transistors P432, P433 decreases, and the current value of the feedback signal If also decreases. The current drop of the feedback signal If decreases the voltage Vi outputted from the regulating unit 1400 shown in FIG. 14, and decreases the output voltage Vo of the charge pump 202. Similarly, the regulating unit 1400 eventually adjusts the output voltage Vi automatically until the output voltage Vo of the charge pump 202 drops to the preset value.

Figure 19:
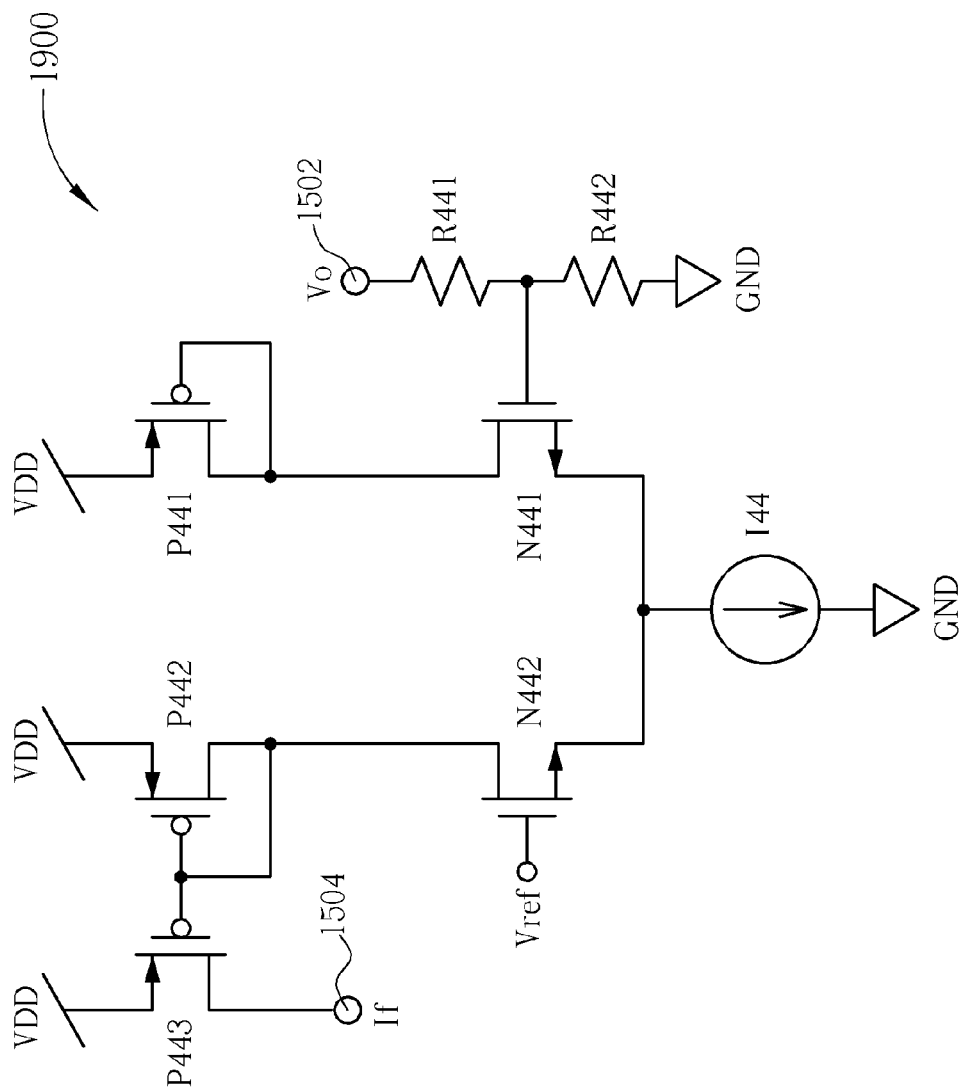

In FIG. 19, resistors R441, R442 realize the voltage division circuit 1506 shown in FIG. 15. NMOS transistors N441, N442 form a differential amplifier, PMOS transistors P442, P443 form a current mirror, and a PMOS transistor P441 forms an active load. The NMOS transistors N441, N442 and the PMOS transistors P441, P442, P443 and the current source 144 realize the voltage to current conversion circuit 1508 shown in FIG. 15, with an operation method narrated as the followings. The voltage Vo divided by the resistors R441, R442 is coupled to the gate of the NMOS transistor N441, and the gate of the NMOS transistor N442 is coupled to a reference voltage Vref. When the load current $I_L$ of the output voltage Vo of the charge pump 202 increases and causes the output voltage Vo to decrease, the gate voltage of the NMOS transistor N441 decreases, so that current generated by the current source 144 flowing into the NMOS transistor N442 increases, and the current value of the feedback signal If flown through the current mirror formed by the PMOS transistors P442, P443 increases accordingly. The current increase of the feedback signal If increases the voltage Vi outputted from the regulating unit 1400 shown in FIG. 14, which raises the output voltage Vo of the charge pump 202. Finally, the regulating unit 1400 automatically adjusts the output voltage Vi until the output voltage Vo of the charge pump 202 rises to a preset value. On the other hand, when the load current $I_L$ of the output voltage Vo of the charge pump 202 decreases and causes the output voltage Vo to increase, the gate voltage of the NMOS transistor N441 increases, so that the current generated from the current source 144 flowing through the NMOS transistor N441 and the PMOS transistor P441 increases, and the current value of the feedback signal If flown through the current mirror formed by the PMOS transistors P442, P443 decreases. The current drop of the feedback signal If decreases the voltage Vi outputted from the regulating unit 1400 shown in FIG. 14, and can decrease the output voltage Vo of the charge pump 202. Similarly, the regulating unit 1400 eventually regulates the output voltage Vi automatically until the output voltage Vo of the charge pump 202 drops to the preset value.

Figure 20:
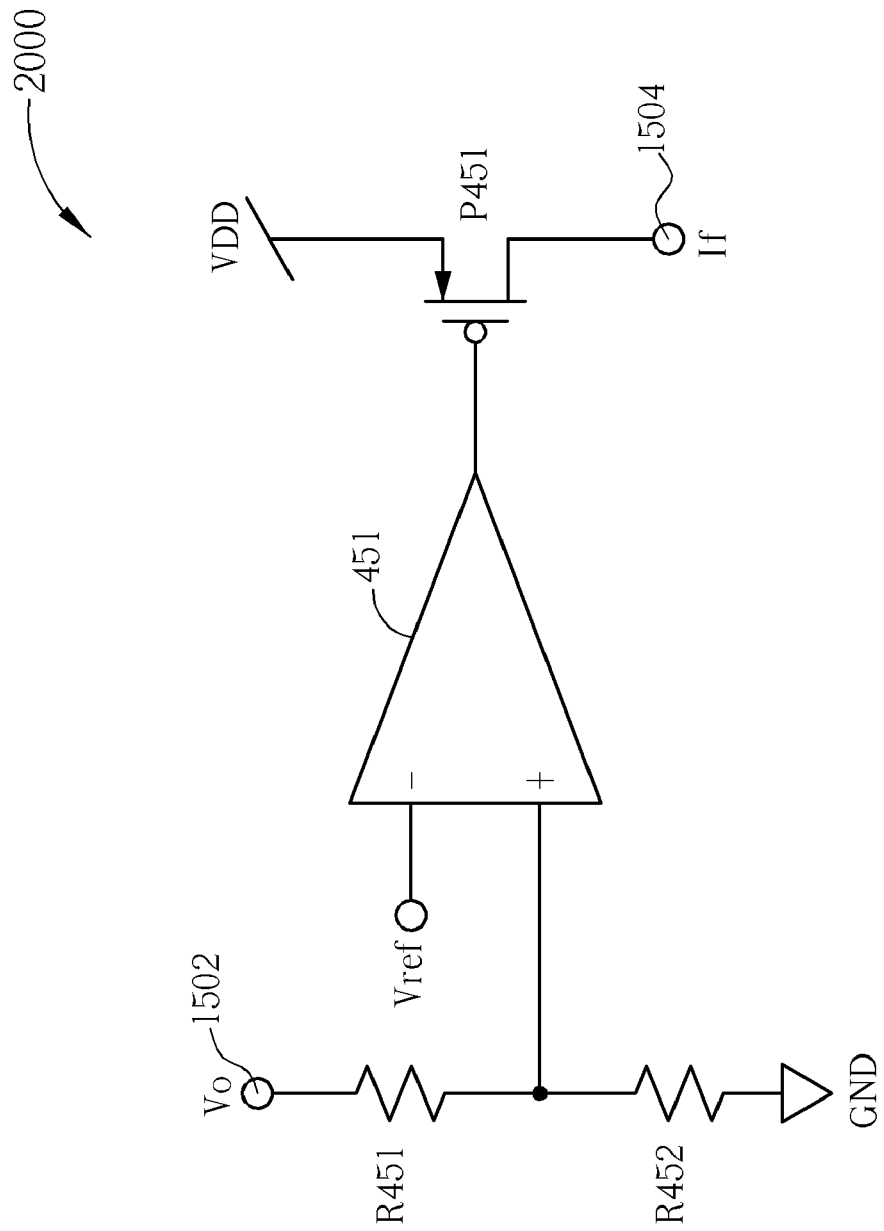
Figure 21:
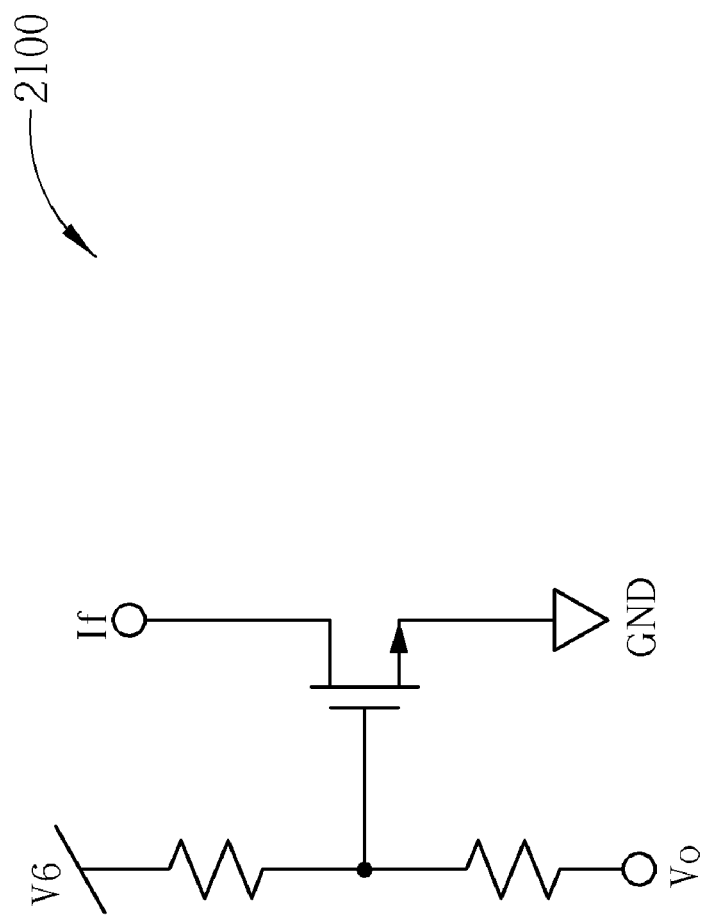
FIG. 21-29 illustrate schematic diagrams of circuits of embodiments for realizing the feedback unit of the present invention.
Figure 22:
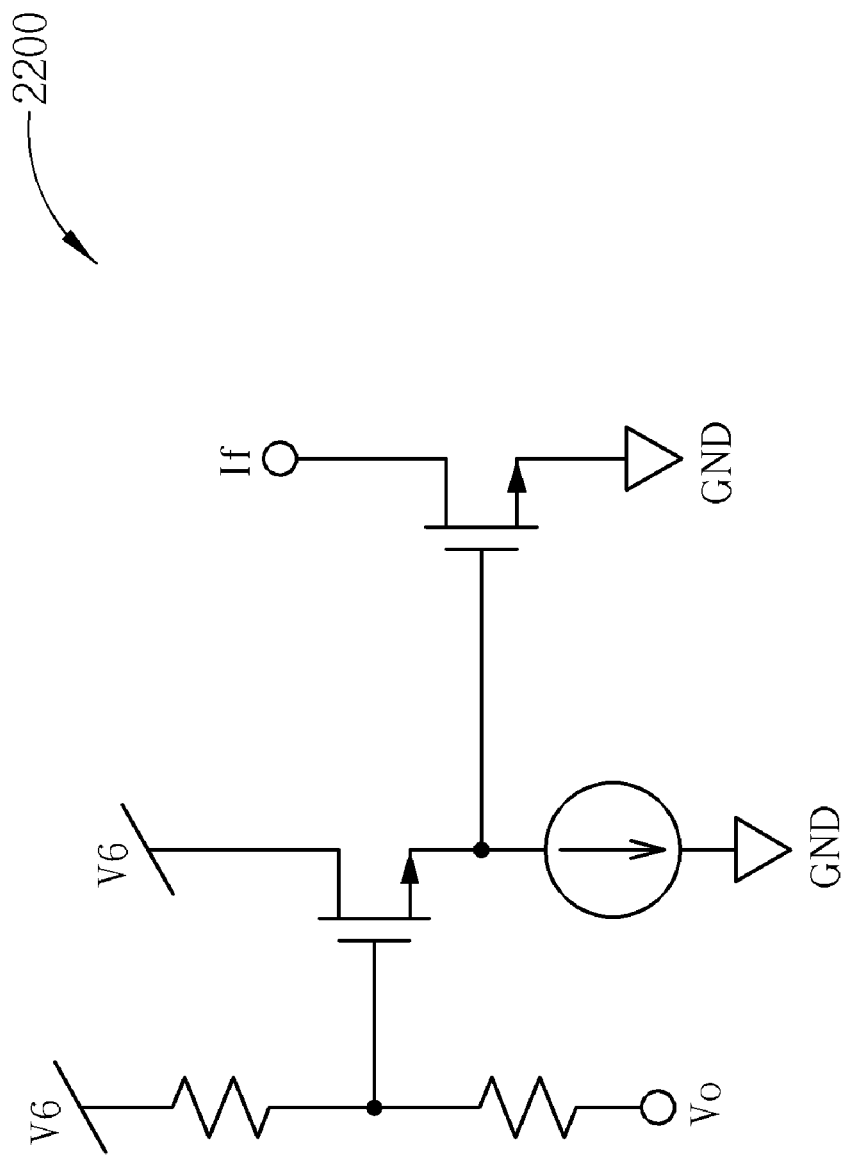
Figure 23:
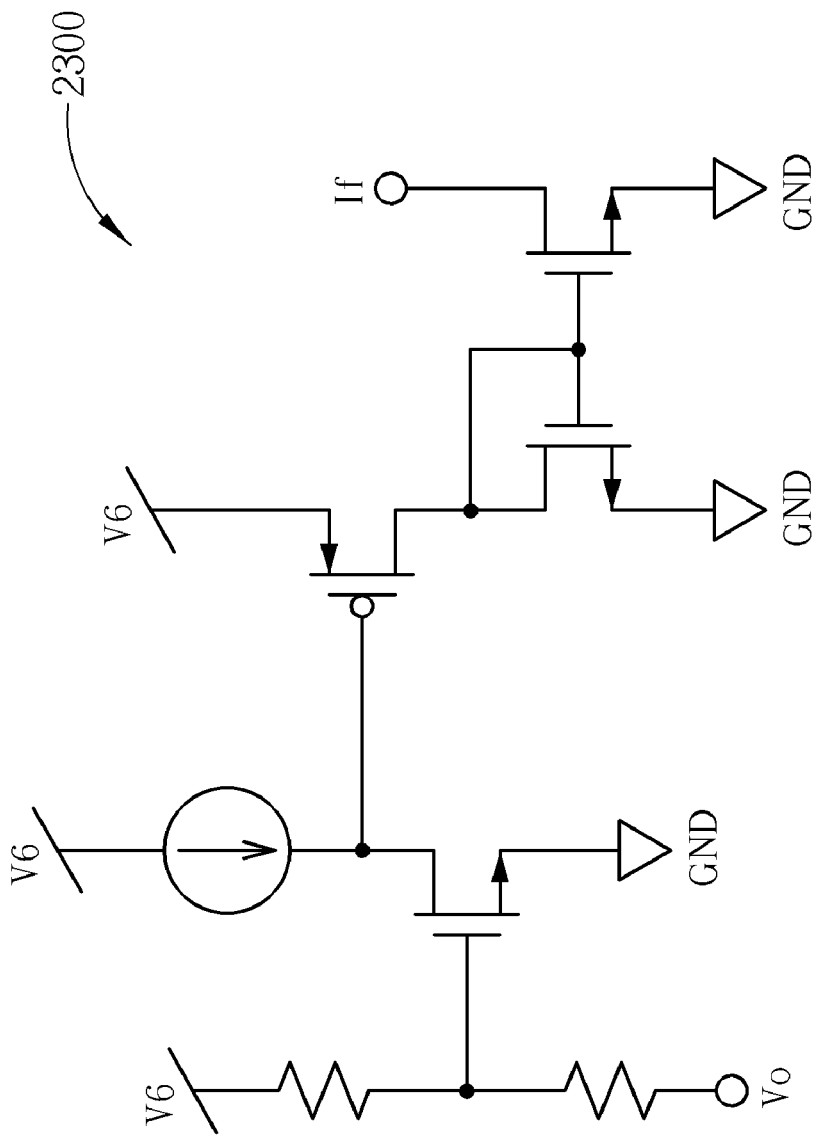
Figure 24:
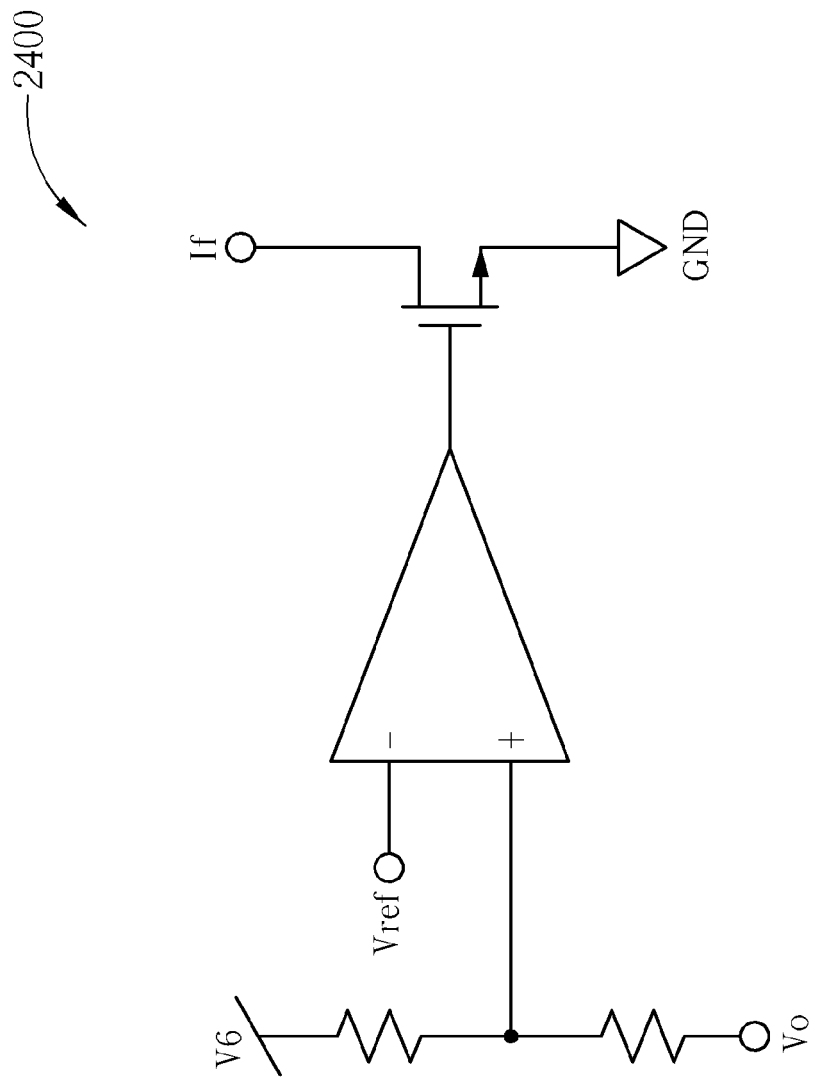
Figure 25:
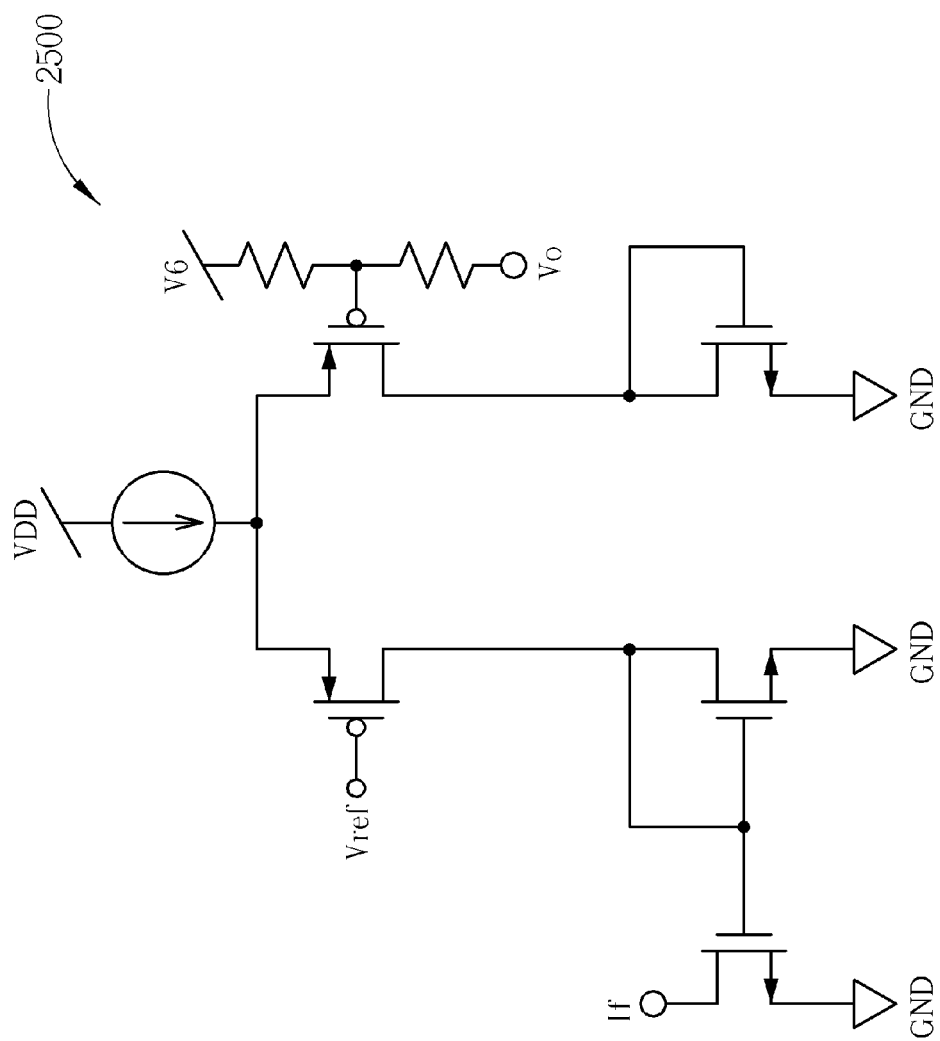
Figure 26:
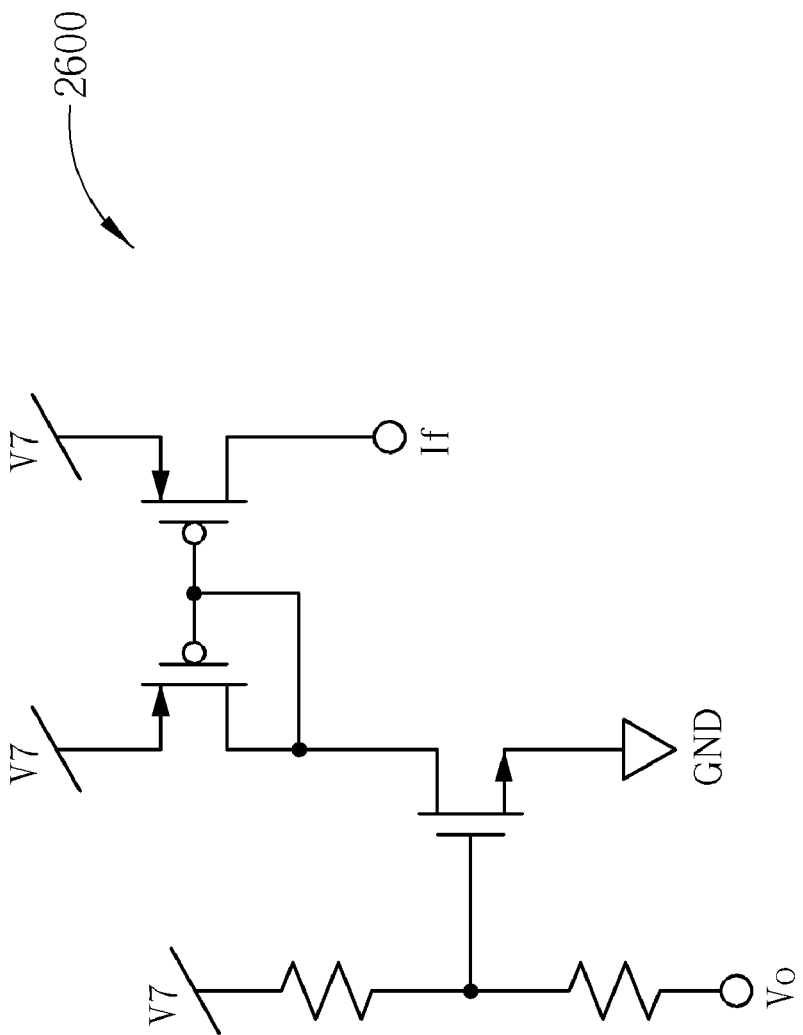
Figure 27:
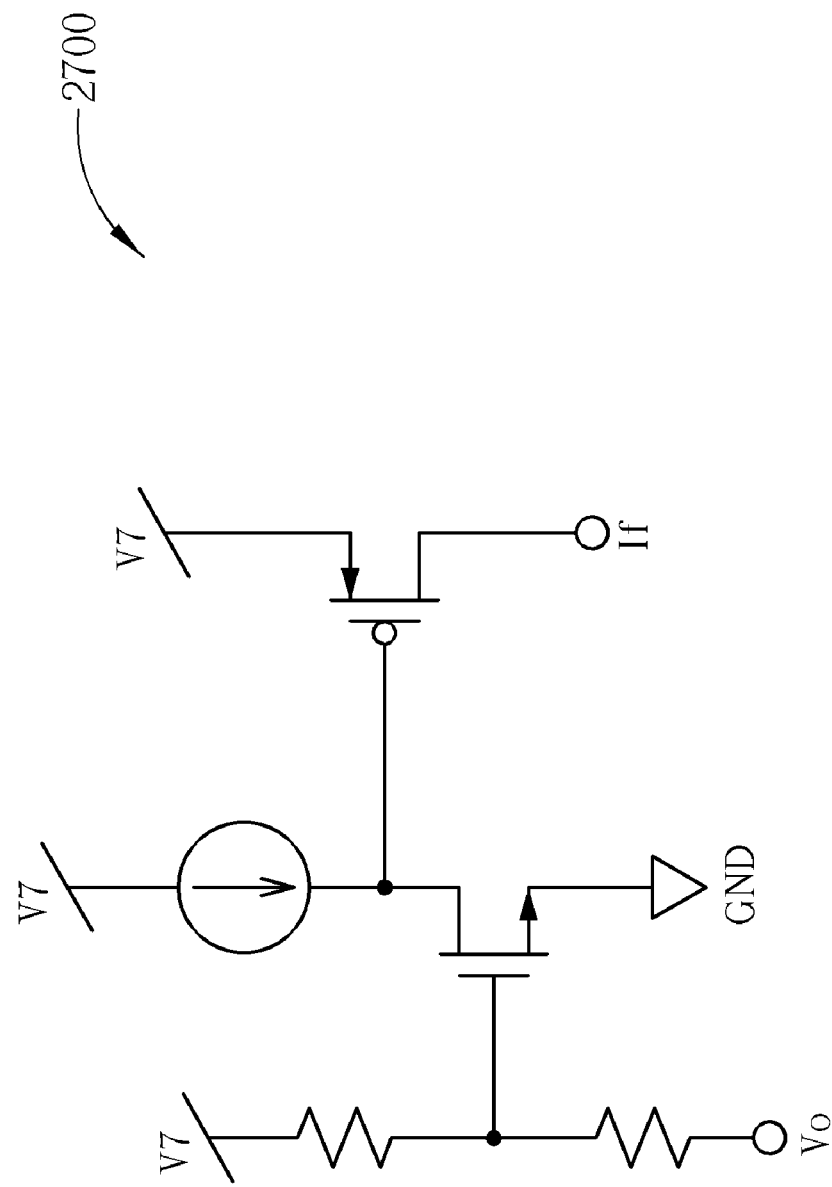
Figure 28:
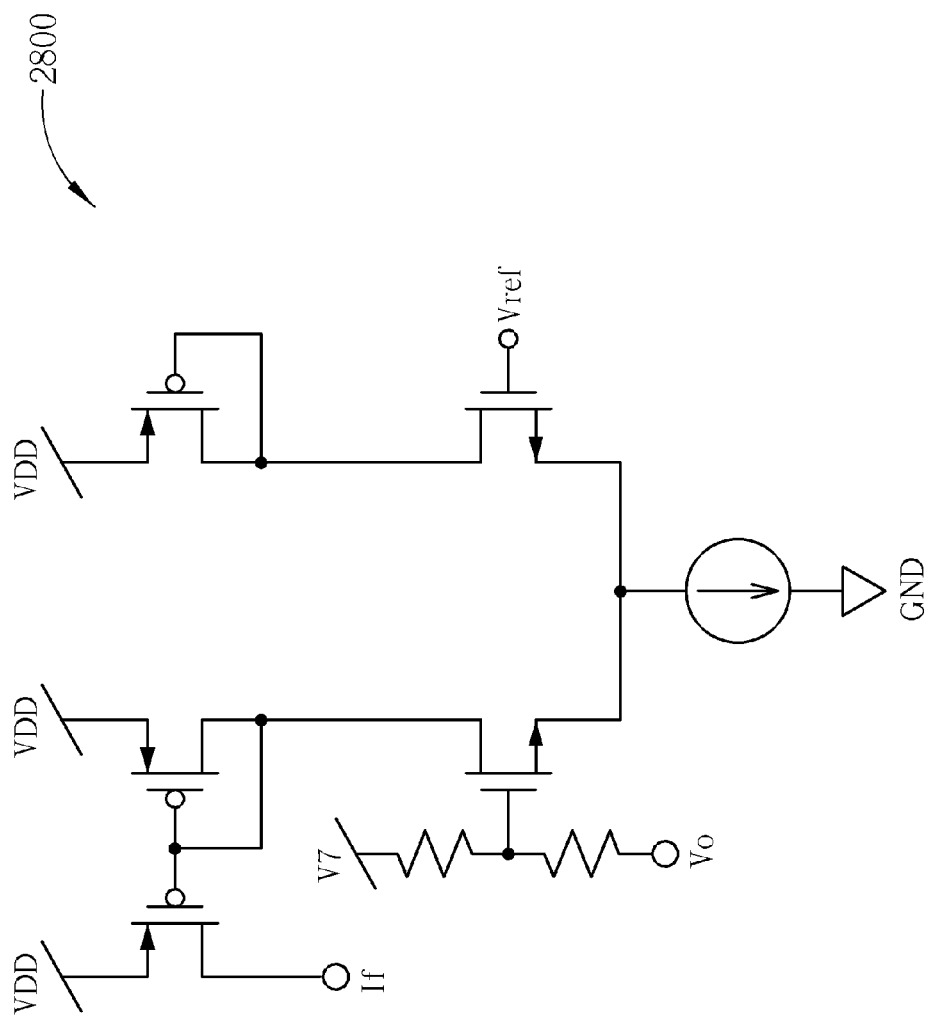
Figure 29:
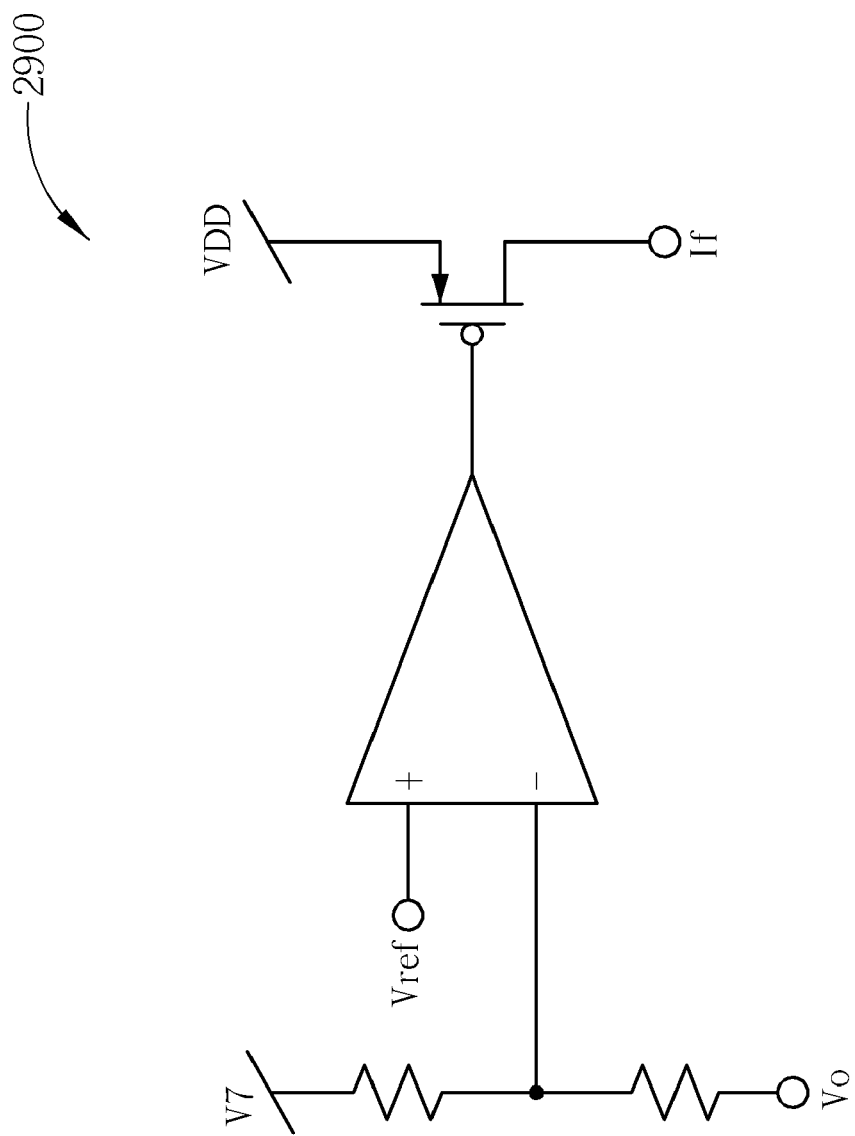

In FIG. 20, resistors R451, R452 realize the voltage division circuit 1506 shown in FIG. 15, an operational amplifier 451 and a PMOS transistor P451 realize the voltage to current conversion circuit 1508 shown in FIG. 15, with an operation method narrated as the followings. The voltage Vo divided by the resistors R451, R452 is coupled to a positive input end of the operational amplifier 451, while a negative input end of the operational amplifier 451 is coupled to a reference voltage Vref, and an output end of operational amplifier 451 is coupled to a gate of the PMOS transistor P451. When the load current $I_L$ of the output voltage Vo of the charge pump 202 increases and causes the output voltage Vo to decrease, the gate voltage of the PMOS transistor P451 decreases, so that the current of the feedback signal generated by the drain of the PMOS transistor P451 increases. The current raise of the feedback signal If increases the voltage Vi outputted from the regulating unit 1400 shown in FIG. 14, and increases the output voltage Vo of the charge pump 202. Finally, the regulating unit 1400 adjusts the output voltage Vi automatically until the output voltage Vo of the charge pump 202 rises to a preset value. On the other hand, when the load current $I_L$ of the output voltage Vo of the charge pump 202 decreases and causes the output voltage Vo to increase, the gate voltage of the PMOS transistor P451 increases, so that the current value of the feedback signal If generated from the drain of the PMOS transistor P451 decreases. The current drop of the feedback signal If decreases the voltage Vi outputted from the regulating unit 1400 shown in FIG. 14. Similarly, the regulating unit 1400 eventually adjusts the output voltage Vi automatically until the output voltage Vo of the charge pump 202 drops to the preset value.

Note that the regulating unit 1400 shown in FIG. 14 and the feedback unit 1500 shown in FIG. 15 are applicable when the output voltage Vo and the input voltage Vi have same polarities and the feedback signal If is a forward current (flowing from the feedback unit 1500 to the regulating unit 1400), and FIG. 16 to FIG. 20 are embodiments of the feedback unit 1500.

When the output voltage Vo and the input voltage Vi are both positive, FIGS. 8-20 reveal embodiments of the regulating unit 201 and the feedback unit 203 for forward or inverse feedback signals If. Similarly, when the output voltage Vo and the input voltage Vi have opposite polarities (meaning that the charge pump 202 generates a negative output voltage Vo), the present invention provides two kinds of embodiments depending on whether the feedback signal If is a forward or an inverse current. When the polarities of the output voltage Vo and the input voltage Vi are opposite and the feedback signal If is an inverse current (flowing into the feedback unit), the required regulating unit 20 can be realized through the regulating unit 800 shown in FIG. 8, and the feedback unit 203 can be realized through circuits 2100, 2200, 2300, 2400, 2500 shown in FIGS. 21-25. When the polarities of the output voltage Vo and the input voltage Vi are opposite, and the feedback signal If is a forward current (flowing out from the feedback unit), the required regulating unit 201 can be realized through the regulating unit 1400 shown in FIG. 14, and the feedback unit 203 can be realized through circuits 2600, 2700, 2800, 2900 shown in FIGS. 26-29. The circuits 2100, 2200, 2300, 2400, 2500, 2600, 2700, 2800, 2900 are generated through modifying or following the circuits 1000, 1100, 1200, 1300, 1600, 1700, 1800, 1900, 2000, while the operation methods mentioned above can be referred, and will not be narrated in detail.

As a conclusion, with the voltage to current feedback control method, the present invention voltage conversion device can automatically adjust the charge pump output voltage with different switch-on resistances and different load currents, to maintain the expected level. When the output voltage of the charge pump varies with the load current, the regulating unit and the feedback unit of the present invention resume the output voltage of the charge pump to the preset value automatically, and are not affected by the switch-on resistance effects of different load currents. In other words, without connecting to a voltage regulator or a voltage stabilization capacitor, the present invention provides a similar stable output voltage, and avoids efficiency loss.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A voltage conversion device comprising:
   a charge pump having an input terminal and an output terminal;
   a feedback unit having an input terminal coupled to the output terminal of the charge pump and a feedback signal end for outputting a feedback signal; and
   a regulating unit coupled to the feedback signal end, comprising:
   an operational amplifier comprising a first input terminal, a second input terminal, and an output terminal;
   a transistor comprising a first terminal coupled to the output terminal of the operational amplifier, a second terminal, and a third terminal coupled to the input terminal of the charge pump;
   a first resistor comprising a first terminal coupled to the third terminal of the transistor, and a second terminal coupled to the second input terminal of the operational amplifier; and
   a second resistor coupled to the second terminal of the first resistor.

2. The voltage conversion device of claim 1, wherein the feedback signal outputted from the feedback unit is generated by drawing a feedback current through the feedback unit.

3. The voltage conversion device of claim 2, wherein the feedback unit comprises:
   an output voltage reception end coupled to the charge pump, for receiving the output voltage from the charge pump;
   a voltage division circuit coupled between the output voltage reception end and a ground end, for generating a voltage division signal; and
   a voltage to current conversion circuit coupled to the voltage division circuit, for drawing the feedback current according to the voltage division signal.

4. The voltage conversion device of claim 3, wherein the voltage division circuit comprises:
   a first resistor comprising one end coupled to the output voltage reception end, and another end coupled to the voltage to current conversion circuit; and
   a second resistor comprising one end coupled to the first resistor and the voltage to current conversion circuit, and another end coupled to the ground end.

5. The voltage conversion device of claim 3, wherein the voltage to current conversion circuit comprises:
   a voltage to current amplifier coupled to the voltage division circuit, for generating the feedback current according to the voltage division signal; and
   a current mirror comprising a first branch coupled to the voltage to current amplifier, and a second branch coupled to the feedback signal end and the ground end, for reflecting current of the first branch to the second branch.

6. The voltage conversion device of claim 5, wherein the voltage to current amplifier is a p-type metal oxide semiconductor transistor comprising a gate coupled to the voltage division circuit, a source coupled to a voltage generator, and a drain coupled to the first branch of the current mirror.

7. The voltage conversion device of claim 5, wherein the voltage to current amplifier is a differential amplifier, and the differential amplifier comprises:
   a first p-type metal oxide semiconductor transistor comprising a gate coupled to the voltage division circuit, a source coupled to a current source, and a drain coupled to the first branch of the current mirror; and
   a second p-type metal oxide semiconductor transistor comprising a gate coupled to a reference voltage, a source coupled to the current source, and a drain coupled to an active load circuit.

8. The voltage conversion device of claim 3, wherein the voltage to current conversion circuit comprises:
   an operational amplifier comprising a positive input end coupled to a reference voltage, a negative input end coupled to the voltage division circuit, and an output end, for comparing the voltage division signal and the reference voltage, for generating a voltage signal; and
   an n-type metal oxide semiconductor transistor comprising a gate coupled to the output end of the operational amplifier, a drain coupled to the feedback signal end, and a source coupled to the ground end, for generating the feedback current according to the voltage signal.

9. The voltage conversion device of claim 3, wherein the voltage to current conversion circuit comprises:
   a common source amplifier, comprising:
   a p-type metal oxide semiconductor transistor comprising a gate coupled to the voltage division circuit, a source coupled to a voltage generator, and a drain, for generating an output voltage according to the voltage division signal; and
   a current source comprising one end coupled to the drain of the p-type metal oxide semiconductor transistor, and another end coupled to the ground end; and
   an n-type metal oxide semiconductor transistor comprising a gate coupled to the drain of the p-type metal oxide semiconductor transistor, a drain coupled to the feedback signal end, and a source coupled to ground end, for generating the feedback current according to the output voltage of the common source amplifier.

10. The voltage conversion device of claim 2, wherein the first input terminal of the operational amplifier is coupled to a reference voltage, the second terminal of the first resistor is coupled to the second input terminal of the operational amplifier and the feedback signal end of the feedback unit, and the second resistor is coupled to the feedback signal end of the feedback unit.

11. The voltage conversion device of claim 2, wherein the feedback unit comprises:
    an output voltage reception end coupled to the charge pump, for receiving the output voltage outputted from the charge pump;
    a voltage division circuit coupled to the output voltage reception end, for generating a voltage division signal; and
    a voltage to current conversion circuit coupled to the voltage division circuit, for drawing the feedback current according to the voltage division signal.

12. The voltage conversion device of claim 11, wherein the voltage division circuit comprises:
    a first resistor comprising one end coupled to the output voltage reception end, and another end coupled to the voltage to current conversion circuit; and
    a second resistor comprising one end coupled to the first resistor and the voltage to current conversion circuit, and another end coupled to the voltage generator.

13. The voltage conversion device of claim 11, wherein the voltage to current conversion circuit is an n-type metal oxide semiconductor transistor comprising a gate coupled to the voltage division circuit, a source coupled to ground end, and a drain coupled to the feedback signal end.

14. The voltage conversion device of claim 11, wherein the voltage to current conversion circuit comprises:

a voltage to current amplifier coupled to the voltage division circuit, for generating the feedback current according to the voltage division signal; and a current mirror comprising a first branch coupled to the voltage to current amplifier, and a second branch coupled to the feedback signal end and the ground end, for reflecting current of the first branch to the second branch.

15. The voltage conversion device of claim 14, wherein the voltage to current amplifier comprises:

a common source amplifier, comprising:

an n-type metal oxide semiconductor transistor comprising a gate coupled to the input end of the common source amplifier, a source coupled to the ground end, and a drain coupled to the output end of the common source amplifier, for generating an output voltage according to the voltage division signal; and a current source comprising one end coupled to the third end of the transistor and the output end of the common source amplifier, and another end coupled to a voltage generator; and a p-type metal oxide semiconductor transistor comprising a gate coupled to the output end of the common source amplifier, a source coupled to a voltage generator, and a drain coupled to the first branch of the current mirror, for generating the feedback current at the third end according to the output voltage of the common source amplifier.

16. The voltage conversion device of claim 14, wherein the voltage to current amplifier is a differential amplifier, and the differential amplifier comprises:

a first p-type metal oxide semiconductor transistor comprising a gate coupled to the voltage division circuit, a source coupled to a current source, and a drain coupled to an active load circuit; and a second p-type metal oxide semiconductor transistor comprising a gate coupled to a reference voltage, a source coupled to the current source, and a drain coupled to the first branch of the current mirror.

17. The voltage conversion device of claim 11, wherein the voltage to current conversion circuit comprises:

an operational amplifier comprising a positive input end coupled to the voltage division circuit, a negative input end coupled to a reference voltage, and an output end, for comparing the voltage division signal and the reference voltage, for generating a voltage signal; and an n-type metal oxide semiconductor transistor comprising a gate coupled to the output end of the operational amplifier, a drain coupled to the feedback signal end, and a source coupled to the ground end, for generating the feedback current according to the voltage signal.

18. The voltage conversion device of claim 11, wherein the voltage to current conversion circuit comprises:

a common drain amplifier, comprising:

a first n-type metal oxide semiconductor transistor comprising a gate coupled to the voltage division circuit, a source coupled to a voltage generator, and a drain, for generating an output voltage according to the voltage division signal; and a current source comprising one end coupled to the drain of the first n-type metal oxide semiconductor transistor, and another end coupled to the ground end; and a second n-type metal oxide semiconductor transistor comprising a gate coupled to the output end of the common drain amplifier, a source coupled to the ground end, and a drain coupled to the feedback signal end, for generating the feedback current at the third end according to the output voltage of the common drain amplifier.

19. The voltage conversion device of claim 2, wherein the first input terminal of the operational amplifier is coupled to a reference voltage, the second terminal of the first resistor is coupled to the second input terminal of the operational amplifier and the feedback signal end of the feedback unit, and the second resistor is coupled to the feedback signal end of the feedback unit.

20. The voltage conversion device of claim 1, wherein the feedback signal outputted from the feedback unit is generated by outputting a feedback current through the feedback unit.

21. The voltage conversion device of claim 20, wherein the feedback unit comprises:

an output voltage reception end coupled to the charge pump, for receiving the output voltage from the charge pump;

a voltage division circuit coupled to the output voltage reception end, for generating a voltage division signal; and a voltage to current conversion circuit coupled to the voltage division circuit, for generating the feedback current according to the voltage division signal.

22. The voltage conversion device of claim 21, wherein the voltage division circuit comprises:

a first resistor comprising one end coupled to the output voltage reception end, and another end coupled to the voltage to current conversion circuit; and a second resistor comprising one end coupled to the first resistor and the voltage to current conversion circuit, and another end coupled to the ground end.

23. The voltage conversion device of claim 21, wherein the voltage to current conversion circuit is a p-type metal oxide semiconductor transistor comprising a gate coupled to the voltage division circuit, a source coupled to a voltage generator, and a drain coupled to the feedback signal end.

24. The voltage conversion device of claim 21, wherein the voltage to current conversion circuit comprises:

a voltage to current amplifier coupled to the voltage division circuit, for generating the feedback current according to the voltage division signal; and a current mirror comprising a first branch coupled to the voltage to current amplifier, and a second branch coupled to the feedback signal end and a voltage generator, for reflecting current of the first branch to the second branch.

25. The voltage conversion device of claim 24, wherein the voltage to current amplifier comprises:

a common source amplifier, comprising:

a p-type metal oxide semiconductor transistor comprising a gate coupled to the voltage division circuit, a source coupled to a voltage generator, and a drain, for generating an output voltage according to the voltage division signal; and a current source comprising one end coupled to the drain of the p-type metal oxide semiconductor transistor, and another end coupled to the ground end; and a n-type metal oxide semiconductor transistor comprising a gate coupled to the drain of the p-type metal oxide semiconductor transistor, a source coupled to the ground end, and a drain coupled to the first branch of the current mirror, for generating the feedback current at the drain according to the output voltage of the common source amplifier.

26. The voltage conversion device of claim 24, wherein the voltage to current amplifier is a differential amplifier, and the differential amplifier comprises:

a first n-type metal oxide semiconductor comprising a gate coupled to the voltage division circuit, a source coupled to a current source, and a drain coupled to an active load circuit; and a second n-type metal oxide semiconductor transistor comprising a gate coupled to a reference voltage, a source coupled to the current source, and a drain coupled to the first branch of the current mirror.

27. The voltage conversion device of claim 21, wherein the voltage to current conversion circuit comprises:

an operational amplifier comprising a positive input end coupled to the voltage division circuit, a negative input end coupled to a reference voltage, and an output end, for comparing the voltage division signal and the reference voltage, for generating a voltage signal; and a p-type metal oxide semiconductor transistor comprising a gate coupled to the output end of the operational amplifier, a drain coupled to the feedback signal end, and a source coupled to a voltage generator, for generating the feedback current according to the voltage signal.

28. The voltage conversion device of claim 21, wherein the voltage to current conversion circuit comprises:

a common source amplifier, comprising:

a first p-type metal oxide semiconductor transistor comprising a gate coupled to the voltage division circuit, a source, and a drain coupled to the ground end, for generating an output voltage according to the voltage division signal; and a current source comprising one end coupled to the source of the first p-type metal oxide semiconductor transistor, and another end coupled to a voltage generator; and a second p-type metal oxide semiconductor transistor comprising a gate coupled to the source of the first p-type metal oxide semiconductor transistor, a drain coupled to the feedback signal end, and a source coupled to a voltage generator, for generating the feedback current according to the output voltage of the common source amplifier.

29. The voltage conversion device of claim 20, wherein the regulating unit further comprises:

a current to voltage conversion circuit coupled to the feedback signal end of the feedback unit, for converting the feedback signal into a feedback voltage signal, comprising:

a reference current source coupled to the feedback signal end of the feedback unit and the first input terminal of the operational amplifier, for outputting a reference current; and a resistor comprising one end coupled to the reference current source, the feedback signal end of the feedback unit and the first input terminal of the operational amplifier, and another end coupled to the ground end;

wherein the first input terminal of the operational amplifier receives the feedback voltage signal, and the second terminal of the first resistor is coupled to the second input terminal of the operational amplifier.

30. The voltage conversion device of claim 20, wherein the feedback unit comprises:

an output voltage reception end coupled to the charge pump, for receiving the output voltage outputted from the charge pump;

a voltage division circuit coupled to the output voltage reception end, for generating a voltage division signal; and a voltage to current conversion circuit coupled to the voltage division circuit, for generating the feedback signal according to the voltage division signal.

31. The voltage conversion device of claim 30, wherein the voltage division circuit comprises:

a first resistor comprising one end coupled to the output voltage reception end, and another end coupled to the voltage to current conversion circuit; and a second resistor comprising one end coupled to the first resistor and the voltage to current conversion circuit, and another end coupled to a voltage generator.

32. The voltage conversion device of claim 30, wherein the voltage to current conversion circuit comprises:

a voltage to current amplifier coupled to the voltage division circuit, for generating the feedback current according to the voltage division signal; and a current mirror comprising a first branch coupled to the voltage to current amplifier, and a second branch coupled to the feedback signal end and a voltage generator, for reflecting current of the first branch to the second branch.

33. The voltage conversion device of claim 32, wherein the voltage to current amplifier is an n-type metal oxide semiconductor transistor comprising a gate coupled to the voltage division circuit, a source coupled to the ground end, and a drain coupled to the first branch of the current mirror.

34. The voltage conversion device of claim 32, wherein the voltage to current amplifier is a differential amplifier, and the differential amplifier comprises:

a first n-type metal oxide semiconductor transistor comprising a gate coupled to the voltage division circuit, a source coupled to a current source, and a drain coupled to the first branch of the current mirror; and a second n-type metal oxide semiconductor transistor comprising a gate coupled to a reference voltage, a source coupled to the current source, and a drain coupled to an active load circuit.

35. The voltage conversion device of claim 30, wherein the voltage to current conversion circuit comprises:

an operational amplifier comprising a positive input end coupled to a reference voltage, a negative input end coupled to the voltage division circuit, and an output end, for comparing the voltage division signal and the reference voltage, for generating a voltage signal; and a p-type metal oxide semiconductor transistor comprising a gate coupled to the output end of the operational amplifier, a drain coupled to the feedback signal end, and a source coupled to a voltage generator, for generating the feedback current according to the voltage signal.

36. The voltage conversion device of claim 30, wherein the voltage to current conversion circuit comprises:

a common source amplifier, comprising:

an n-type metal oxide semiconductor transistor comprising a gate coupled to the voltage division circuit, a source coupled to the ground end, and a drain, for generating an output voltage according to the voltage division signal; and a current source comprising one end coupled to the drain of the n-type metal oxide semiconductor transistor, and another end coupled to a voltage generator; and a p-type metal oxide semiconductor transistor comprising a gate coupled to the drain of the n-type metal oxide semiconductor transistor, a source coupled to a voltage generator, and a drain coupled to the feedback signal end, for generating the feedback current at the drain according to the output voltage of the common source amplifier.

37. The voltage conversion device of claim 20, wherein the regulating unit further comprises:
- a current to voltage conversion circuit coupled to the feedback signal end of the feedback unit, for converting the feedback signal into a feedback voltage signal, comprising:
  - a reference current source coupled to the feedback signal end of the feedback unit and the first input terminal of the operational amplifier, for outputting a reference current; and
  - a resistor comprising one end coupled to the reference current source, the feedback signal end of the feedback unit and the first input terminal of the operational amplifier, and another end coupled to the ground end;
- wherein the first input terminal of the operational amplifier receives the feedback voltage signal, and the second terminal of the first resistor is coupled to the second input terminal of the operational amplifier.

* * * * *